United States Patent
Kidoh et al.

(10) Patent No.: US 7,982,261 B2
(45) Date of Patent: Jul. 19, 2011

(54) NONVOLATILE SEMICONDUCTOR MEMORY DEVICE AND METHOD FOR MANUFACTURING SAME

(75) Inventors: Masaru Kidoh, Tokyo (JP); Hiroyasu Tanaka, Tokyo (JP); Ryota Katsumata, Kanagawa-ken (JP); Masaru Kito, Kanagawa-ken (JP); Yosuke Komori, Kanagawa-ken (JP); Megumi Ishiduki, Kanagawa-ken (JP); Hideaki Aochi, Kanagawa-ken (JP); Yoshiaki Fukuzumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/563,832

(22) Filed: Sep. 21, 2009

(65) Prior Publication Data

US 2010/0109072 A1    May 6, 2010

(30) Foreign Application Priority Data

Nov. 5, 2008   (JP) ................. 2008-284375

(51) Int. Cl.
    H01L 29/792    (2006.01)
(52) U.S. Cl. ........... 257/324; 257/326; 257/E29.309; 257/E21.423; 257/E21.679; 257/314; 438/264; 365/185.11
(58) Field of Classification Search .......... 257/E21.679; 438/674, 678, 640, 638, 639, 588, 267
    See application file for complete search history.

(56) References Cited

U.S. PATENT DOCUMENTS

2007/0252201 A1 * 11/2007 Kito et al. .............. 257/331

FOREIGN PATENT DOCUMENTS

| JP | 2007-266143 | | 10/2007 |
|----|-------------|---|---------|
| JP | 2007317874 A | * | 12/2007 |
| JP | 2009-146954 | | 7/2009 |
| WO | WO 2009/075370 A1 | | 6/2009 |

OTHER PUBLICATIONS

U.S. Appl. No. 12/851,054, Aug. 5, 2010, Katsumata, et al.
U.S. Appl. No. 12/851,002, Aug. 5, 2010, Katsumata, et al.

* cited by examiner

Primary Examiner — Matthew C Landau
Assistant Examiner — Khaja Ahmad
(74) Attorney, Agent, or Firm — Oblon, Spivak, McClelland, Maier & Neustadt, L.L.P.

(57) ABSTRACT

A nonvolatile semiconductor memory device includes a first stacked body on a silicon substrate, and a second stacked body is provided thereon. The first stacked body includes a plurality of insulating films alternately stacked with a plurality of electrode films, and a first portion of a through-hole extending in a stacking direction is formed. The second stacked body includes a plurality of insulating films alternately stacked with a plurality of electrode films, and a second portion of the through-hole is formed. A memory film is formed on an inner face of the through-hole, and a silicon pillar is buried in an interior of the through-hole. A central axis of the second portion of the through-hole is shifted from a central axis of the first portion, and a lower end of the second portion is positioned lower than an upper portion of the first portion.

20 Claims, 20 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2008-284375, filed on Nov. 5, 2008; the entire contents of which are incorporated herein by reference.

BACKGROUND OF THE INVENTION

1. Field of the Invention

This invention relates to a nonvolatile semiconductor memory device including multiple insulating films alternately stacked with multiple electrode films and a method for manufacturing the same.

2. Background Art

Nonvolatile semiconductor memory devices of flash memory and the like conventionally are fabricated by two-dimensionally integrating memory cells on a surface of a silicon substrate. In such a semiconductor memory device, it is necessary to increase the integration of memory cells to reduce the cost per bit and increase the storage capacity. However, such high integration in recent years has become difficult in regard to both cost and technology.

Many ideas for three-dimensionally integrated elements are proposed as a technique to breakthrough the limitations of increasing the integration. Even for a constant minimum patterning dimension, the capacity can be increased not only in the plane but also by stacking elements in the perpendicular direction. However, three-dimensional devices generally require several lithography processes for each layer. Therefore, the increase of costs accompanying the increase of lithography processes unfortunately cancels the cost reductions gained by surface area reductions of the silicon substrate; and it is difficult to reduce costs even using three dimensions.

In consideration of such problems, the inventors have proposed a collectively patterned three-dimensional stacked memory (for example, refer to JP-A 2007-266143 (Kokai)). In such technique, a stacked body is formed on a silicon substrate by alternately stacking electrode films and insulating films and subsequently making through-holes in the stacked body by collective patterning. A charge storage layer is formed on a side face of each through-hole, and silicon is buried in an interior of the through-hole to form a silicon pillar. A memory cell is thereby formed at an intersection between each electrode film and the silicon pillar.

In such a collectively patterned three-dimensional stacked memory, a charge can be removed from and put into the charge storage layer from the silicon pillar to record information by controlling electric potential of each electrode film and each silicon pillar. According to such technique, the chip surface area per bit and the cost can be reduced by stacking multiple electrode films on the silicon substrate. Moreover, the three-dimensional stacked memory can be fabricated by collectively patterning the stacked body. Therefore, the number of lithography processes does not increase, and the cost can be prevented from increasing even in the case where the number of stacks increases.

However, it is difficult to collectively make the through-holes in such a collectively patterned three-dimensional stacked memory in the case where the number of stacks increases. It is therefore necessary to make the through-holes by multiple processes. In such a case where the through-hole formed previously is shifted from the through-hole formed thereafter, the cross-sectional area of a connecting portion between the through-holes is undesirably small and increased resistance or opens unfortunately occur in the silicon pillar.

SUMMARY OF THE INVENTION

According to an aspect of the invention, there is provided a nonvolatile semiconductor memory device, including: a first stacked body including a plurality of insulating films alternately stacked with a plurality of electrode films; a second stacked body provided on the first stacked body, the second stacked body including a plurality of insulating films alternately stacked with a plurality of electrode films; a through-hole extending in a stacking direction of the first and second stacked bodies to pass through the first and second stacked bodies; an insulating layer formed on an inner face of the through-hole; and a semiconductor pillar buried in an interior of the through-hole, a central axis of a second portion of the through-hole formed in the second stacked body being shifted in a direction intersecting the stacking direction from a central axis of a first portion of the through-hole formed in the first stacked body, a lower end of the second portion being positioned lower than an upper end of the first portion.

According to another aspect of the invention, there is provided a nonvolatile semiconductor memory device, including: a first stacked body including a plurality of insulating films alternately stacked with a plurality of electrode films; a second stacked body provided on the first stacked body, the second stacked body including a plurality of insulating films alternately stacked with a plurality of electrode films; a through-hole extending in a stacking direction of the first and second stacked bodies to pass through the first and second stacked bodies; an insulating layer formed on an inner face of the through-hole; and a semiconductor pillar buried in an interior of the through-hole, the through-hole including a plurality of portions having mutually shifted central axes, a connecting portion between the portions having a crank-like configuration.

According to still another aspect of the invention, there is provided a method for manufacturing a nonvolatile semiconductor memory device, including: alternately stacking a plurality of insulating films and a plurality of electrode films on a substrate to form a first stacked body; forming a first through-hole in the first stacked body to extend in a stacking direction of the first stacked body; burying a sacrificial member in the first through-hole; alternately stacking a plurality of insulating films and a plurality of electrode films on the first stacked body to form a second stacked body; forming a second through-hole in the second stacked body to extend in the stacking direction and communicate with the first through-hole; performing etching via the second through-hole to remove the sacrificial member; forming an insulating layer on an inner face of the first and second through-holes; and burying a semiconductor material in an interior of the first and second through-holes to form a semiconductor pillar, the second through-hole being formed to enter into an interior of the first stacked body.

DETAILED DESCRIPTION OF THE INVENTION

Embodiments of the invention will now be described with reference to the drawings.

First, a first embodiment of the invention will be described.

Figures 1A, 1B:
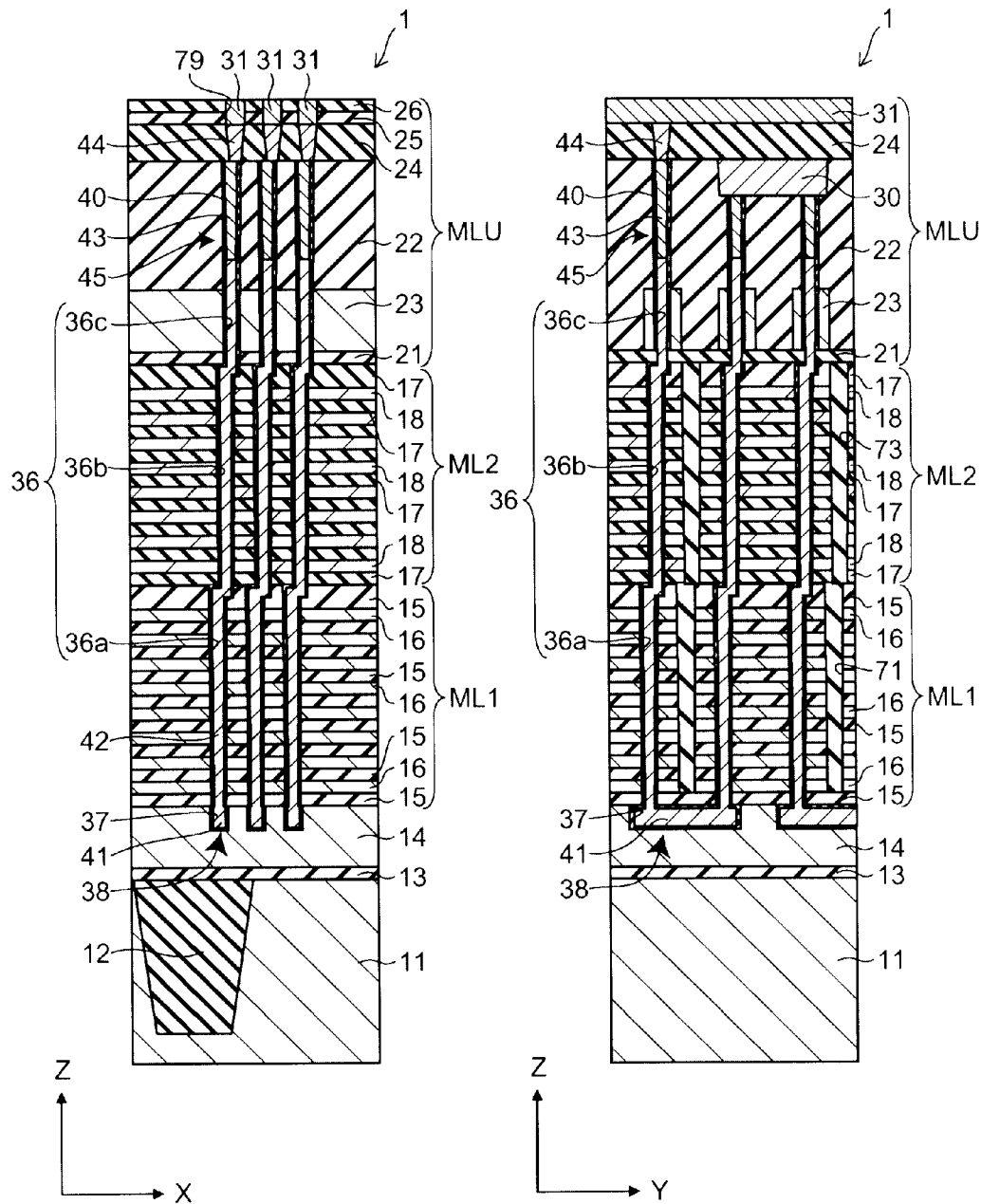
FIGS. 1A and 1B are mutually orthogonal cross-sectional views illustrating a nonvolatile semiconductor memory device according to a first embodiment of the invention.

FIGS. 1A and 1B are mutually orthogonal cross-sectional views illustrating a nonvolatile semiconductor memory device according to this embodiment.

Figure 2:
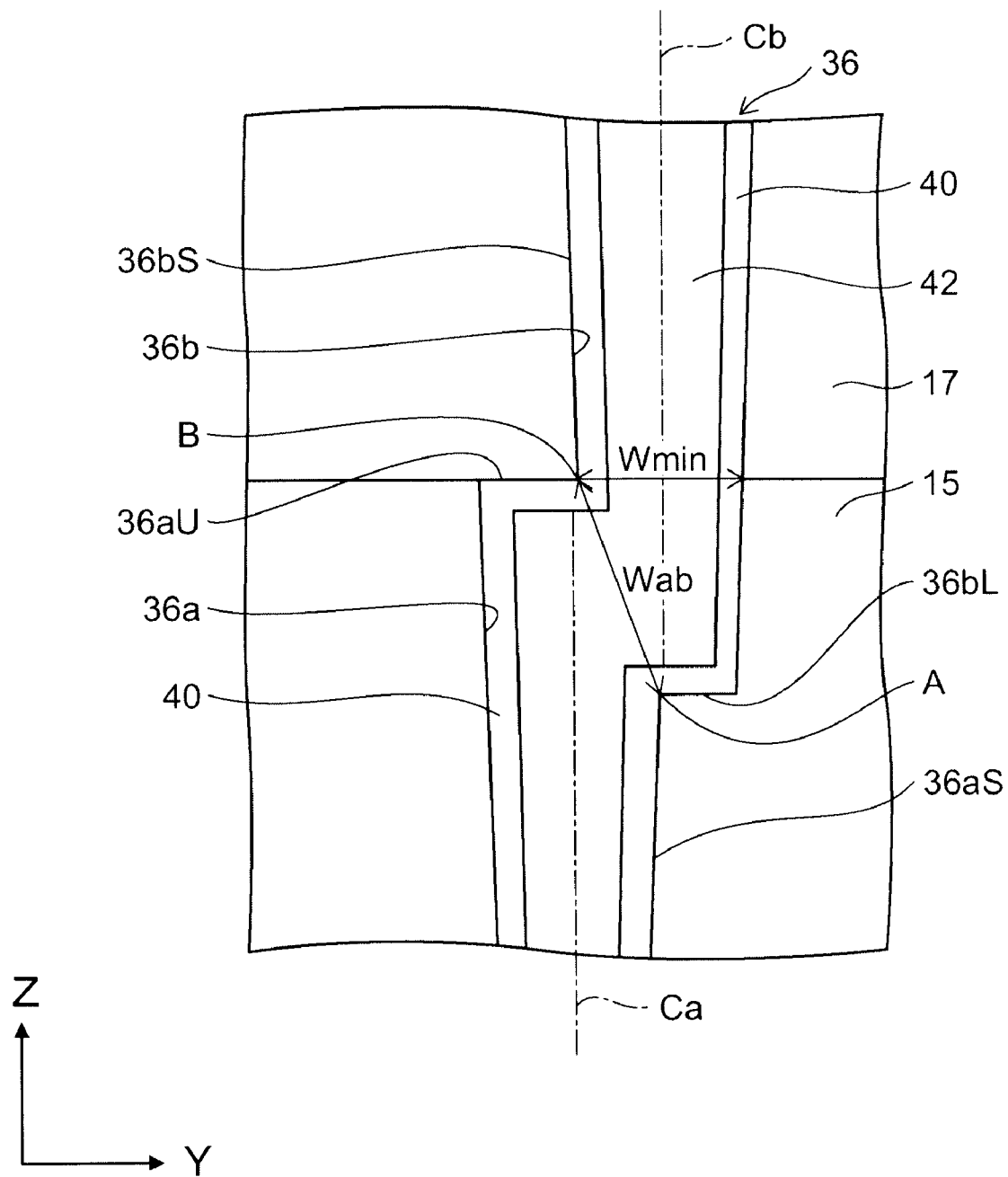
FIG. 2 is a cross-sectional view illustrating a connecting portion of a through-hole of the nonvolatile semiconductor memory device illustrated in FIGS. 1A and 1B.

FIG. 2 is a cross-sectional view illustrating a connecting portion of a through-hole of the nonvolatile semiconductor memory device illustrated in FIGS. 1A and 1B.

A silicon substrate 11 is provided in a nonvolatile semiconductor memory device 1 according to this embodiment illustrated in FIGS. 1A and 1B. An element separation film 12 is formed in an upper layer portion of the silicon substrate 11. A silicon oxide film 13 is formed on the upper face of the silicon substrate 11. A conductive film 14 made of, for example, polysilicon is provided thereupon.

An XYZ orthogonal coordinate system is introduced in the specification for convenience of description hereinbelow. In this coordinate system, an X direction and a Y direction are assumed to be two mutually orthogonal directions parallel to the upper face of the silicon substrate 11. A Z direction is assumed to be a direction orthogonal to both the X direction and the Y direction, that is, the stacking direction of the silicon oxide film 13 and the conductive film 14.

Multiple insulating films 15 and multiple electrode films 16 are alternately stacked on the conductive film 14 to form a stacked body ML1. Each of the lowermost layer and the uppermost layer of the stacked body ML1 is formed of the insulating film 15. The electrode films 16 made of, for example, polysilicon are conductive and function as word lines of the device 1. The insulating films 15 made of, for example, silicon oxide are insulative and function as interlayer dielectric films to insulate the electrode films 16 from each other.

Multiple insulating films 17 and multiple electrode films 18 are alternately stacked on the stacked body ML1 to form a stacked body ML2. Each of the lowermost layer and the uppermost layer of the stacked body ML2 is formed of the insulating film 17. The electrode films 18 made of, for example, polysilicon are conductive and function as word lines of the device 1. The insulating films 17 made of, for example, silicon oxide are insulative and function as interlayer dielectric films to insulate the electrode films 18 from each other.

The insulating films 15 and 17 exist between the electrode film 16 of the uppermost layer of the stacked body ML1 and the electrode film 18 of the lowermost layer of the stacked body ML2. The distance between these electrode films is larger than the distance between the electrode films 16 in the stacked body ML1 and the distance between the electrode films 18 in the stacked body ML2.

An insulating film 21 made of, for example, silicon oxide is provided on the stacked body ML2. An insulating film 22 made of, for example, silicon oxide is provided thereupon. Multiple select gate electrodes 23 extending in the X direction are provided in the lower layer portion of the insulating film 22. Multiple source lines 30 extending in the X direction are provided in the upper layer portion of the insulating film 22. An insulating film 24 made of, for example, a silicon oxide film, an insulating film 25 made of a silicon nitride film, an insulating film 26 made of a silicon oxide film, and multiple bit lines 31 extending in the Y direction are further provided on the insulating film 22. An upper stacked body MLU is formed of the insulating films 21, 22, and 24, the select gate electrodes 23, the source lines 30, and the bit lines 31.

The source lines 30 are formed of, for example, tungsten (W). The bit lines 31 are formed of, for example, copper (Cu). In the Z direction, all of the insulating films positioned from the silicon oxide film 13 to the insulating film 24 are formed of silicon oxide ($SiO_2$); and all of the conductive films positioned between the silicon oxide film 13 and the insulating film 24 except for the source lines 30 and the bit lines 31 are formed of silicon (Si), e.g., polysilicon. Accordingly, the stacked structure from the silicon oxide film 13 to the insulating film 24 is formed of only silicon oxide and silicon. The conductive films may be formed of amorphous silicon instead of polysilicon.

Multiple through-holes 36 extending in the Z direction are formed in the interior of the upper stacked body MLU, the stacked body ML2, and the stacked body ML1. The through-holes 36 are arranged in a matrix configuration along the X direction and the Y direction to pass through the stacked body ML1 and the stacked body ML2. A recess 37 having a rectangular configuration extending in the Y direction is formed in the upper layer portion of the conductive film 14. Each of the two end portions in the Y direction of the recess 37 communicates with the lower end portion of one of the through-holes 36. Thereby, one continuous U-shaped pipe 38 is formed of one recess 37 and two through-holes 36 adjacent in the Y direction.

A memory film 40 is formed as an insulating layer on an inner face of the U-shaped pipe 38. The memory film 40 is an ONO (Oxide Nitride Oxide) film including, for example, a blocking film made of silicon oxide, a charge trap film made of silicon nitride, and a tunnel film made of silicon oxide stacked in order from the outside of the U-shaped pipe 38, that is, the side contacting the electrode film 16 and the like. However, the film structure of the memory film 40 is not limited thereto.

Of the U-shaped pipe 38, a semiconductor material, e.g., polysilicon, is buried in the interiors of the recess 37 formed in the conductive film 14, a portion 36a of the through-hole 36 formed in the stacked body ML1, a portion 36b of the through-hole 36 formed in the stacked body ML2, and a lower portion of a portion 36c of the through-hole 36 formed in the upper stacked body MLU. Thereby, a connection member 41 is formed in the recess 37, and a silicon pillar 42 is buried in the interiors of the portion 36a, the portion 36b, and the lower portion of the portion 36c of the through-hole 36. The connection member 41 and the silicon pillars 42 are formed integrally. On the other hand, metal is buried in the interior of the upper portion of the portion 36c of the through-hole 36 to form a via 43.

Thereby, one U-shaped pillar 45 is formed of the via 43, the silicon pillar 42, the connection member 41, the silicon pillar 42, and the via 43 connected in series in this order. One of the two vias 43 belonging to each U-shaped pillar 45 directly connects to the source line 30; the other via 43 connects to the bit line 31 via a metal plug 44 buried in the insulating film 24. In other words, the U-shaped pillar 45 is connected between the source line 30 and the bit line 31. The electrode films 16 and 18 are divided between two silicon pillars 42 belonging to one U-shaped pillar 45 and are patterned into line configurations extending in the X direction.

As described above, the portions 36a to 36c of the through-hole 36 mutually communicate; and the entirety thereof makes one through-hole 36. Each of the portions 36a to 36c of the through-hole 36 has a substantially columnar configuration extending in the Z direction. Each of the portions 36a to 36c may have a tapered configuration becoming finer downward. The portion 36b is disposed above the portion 36a. The portion 36c is disposed above the portion 36b.

As illustrated in FIG. 2, a central axis Cb of the portion 36b is shifted with respect to a central axis Ca of the portion 36a in a direction orthogonal to the Z direction, that is, at least one of the X direction and the Y direction. Restated, each of the portions 36a, 36b, and 36c may be considered to be a portion sharing the same central axis. A lower end 36bL of the portion 36b is positioned lower than an upper end 36aU of the portion 36a. In other words, the portion 36a and the portion 36b are formed to overlap, and the configuration of a connecting portion has a crank-like configuration. Thereby, a path extending in a horizontal direction (the X direction or the Y direction) is formed in the connecting portion.

A minimum width Wab of the connecting portion between the portion 36a and the portion 36b in a cross section including both the central axis Ca of the portion 36a and the central axis Cb of the portion 36b is larger than a minimum width Wmin of the entire through-hole 36. In other words, the position where the width of the through-hole 36 has a minimum value Wmin is at a portion other than the connecting portion between the portion 36a and the portion 36b. As illustrated in FIG. 2, the minimum width Wab of the connecting portion is the distance from an intersection point A between a side face 36aS of the portion 36a and a lower face of the portion 36b to an intersection point B between a side face 36bS of the portion 36b and an upper face of the portion 36a.

The positional relationship between the portion 36b and the portion 36c of the through-hole 36 is similar thereto. The central axis of the portion 36c is shifted from the central axis of the portion 36b; a lower end of the portion 36c is positioned lower than an upper end of the portion 36b; and the connecting portion has a crank-like configuration. The minimum width of the connecting portion in a plane including both the central axis of the portion 36b and the central axis of the portion 36c is larger than the minimum width of the entire through-hole.

A memory unit of the device 1 is formed of the stacked bodies ML1 and ML2. Although the two stacked bodies ML1 and ML2 form the memory unit in the example illustrated in this embodiment, the invention is not limited thereto. For example, the memory unit may be formed of three or more stacked bodies arranged in the Z direction.

In the memory unit, the silicon pillar 42 forms a channel, the electrode films 16 and 18 form gate electrodes, and the charge trap film of the memory film 40 forms a charge storage film. Thereby, a memory transistor is formed at the intersection between the silicon pillar 42 and the electrode films 16 and 18. Above the memory unit, the silicon pillar 42 forms a channel, the select gate electrode 23 forms a gate electrode, and the memory film 40 forms a gate insulation film. Thereby, a select transistor is formed at the intersection between the select gate electrode 23 and the silicon pillar 42. Thereby, a pair of select transistors is provided on the end portions of the U-shaped pillar 45 and multiple memory transistors are connected in series between the pair of select transistors to form a memory string.

A method for manufacturing the nonvolatile semiconductor memory device according to this embodiment will now be described.

FIG. 3A to FIG. 15B are process cross-sectional views illustrating the method for manufacturing the nonvolatile semiconductor memory device according to this embodiment. FIG. A of each of these drawings illustrates a cross section (XZ cross section) orthogonal to the bit line extension direction. FIG. B of each of these drawings illustrates a cross section (YZ cross section) orthogonal to the select gate electrode extension direction.

Figure 3A:
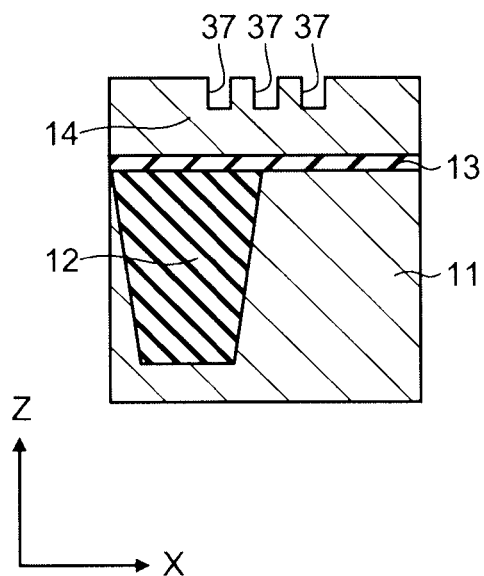
FIG. 3A to FIG. 15B are cross-sectional views illustrating a method for manufacturing the nonvolatile semiconductor memory device according to the first embodiment.
Figure 3B:
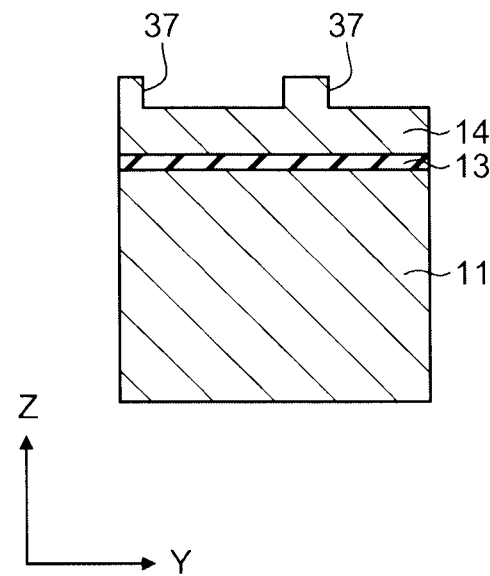

First, the silicon substrate 11 illustrated in FIGS. 3A and 3B is prepared. The element separation film 12 is formed in an upper layer portion of the silicon substrate 11. The silicon oxide film 13 is then formed on the upper face of the silicon substrate 11. Then, polysilicon, for example, is deposited on the silicon oxide film 13 to form the conductive film 14. The recesses 37 having rectangular configurations extending in the Y direction are then formed in the upper face of the conductive film 14. Multiple recesses 37 are formed and arranged in a matrix configuration.

Figure 4A:
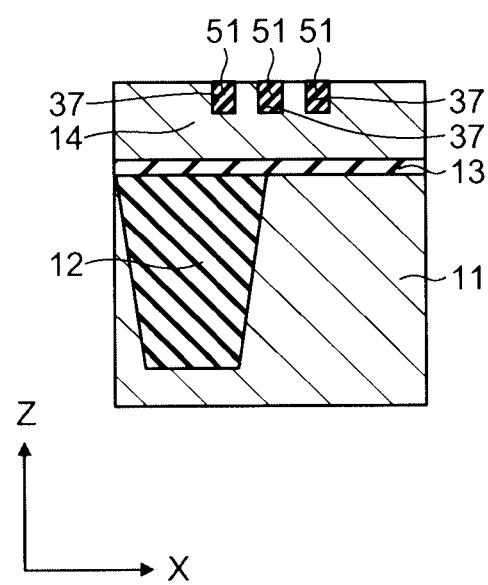
Figure 4B:
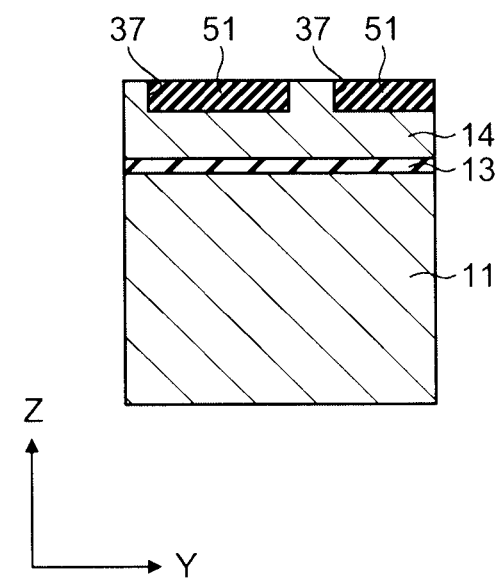

Continuing as illustrated in FIGS. 4A and 4B, sacrificial members 51 are buried in the recesses 37 by depositing a sacrificial member on the entire surface of the conductive film 14 and then performing etch-back. A material, e.g., silicon nitride, is used as the sacrificial member such that etching selectivity is possible with the polysilicon forming the conductive film 14, the polysilicon forming the electrode films 16 and 18 (referring to FIGS. 1A and 1B), and the silicon oxide forming the insulating films 15 and 17 (referring to FIGS. 1A and 1B).

Figures 5A, 5B:
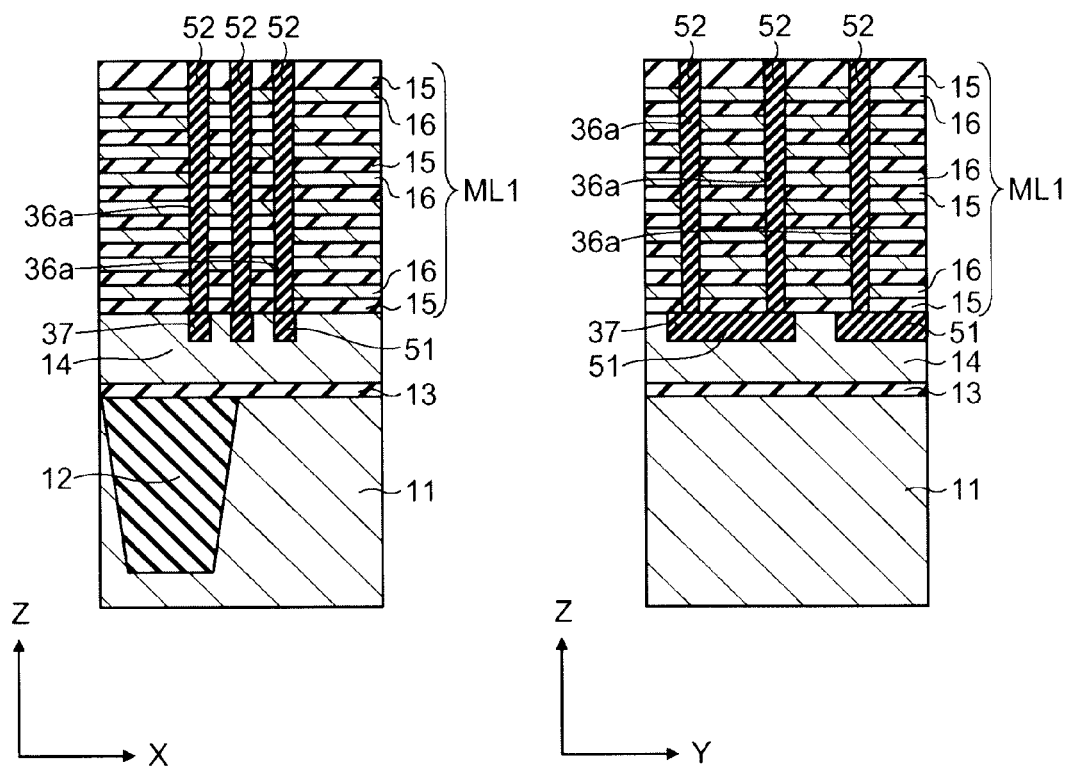

Then, as illustrated in FIGS. 5A and 5B, multiple insulating films 15 and multiple electrode films 16 are alternately stacked on the conductive film 14 to form the stacked body ML1. Here, each of the lowermost layer and the uppermost layer of the stacked body ML1 is the insulating film 15. RIE (Reactive Ion Etching) and the like are then used to make the portions 36a of the through-holes 36 (referring to FIGS. 1A and 1B) extending in the Z direction as first through-holes of the stacked body ML1. At this time, the portions 36a are arranged in a matrix configuration along the X direction and the Y direction. Two of the portions 36a adjacent in the Y direction reach the two end portions of the recess 37. Sacrificial members 52 are then buried in the portions 36a by depositing a sacrificial member on the entire surface and performing etching such that the sacrificial member remains only in the portions 36a. Each of the sacrificial members 52 contacts the sacrificial member 51 in the recess 37.

Figure 6A:
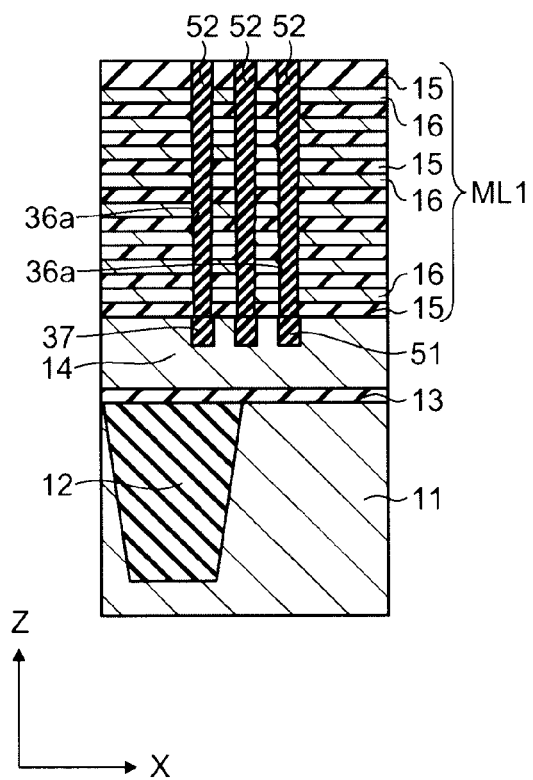
Figure 6B:
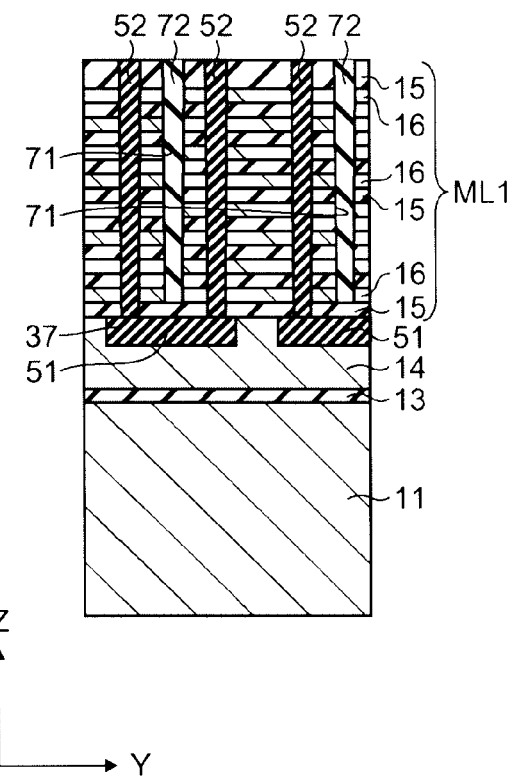

Continuing as illustrated in FIGS. 6A and 6B, a trench 71 extending in the X direction is formed in the stacked body ML1 to connect the regions directly above the recesses 37. The trench 71 is formed to a depth to pass through the electrode film 16 of the lowermost layer of the stacked body ML1 without reaching the conductive film 14. Thereby, the electrode films 16 of the stacked body ML1 are patterned into line configurations extending in the X direction and divided between the two portions 36a mutually communicating via the recess 37. An insulating material 72 is then buried in the trench 71, and the upper face is planarized by etch-back and the like.

Figure 7A:
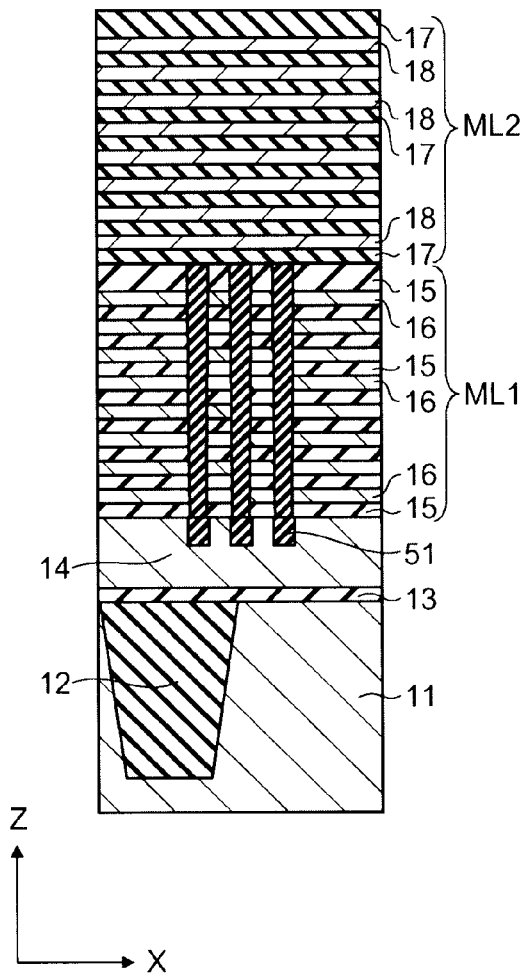
Figure 7B:
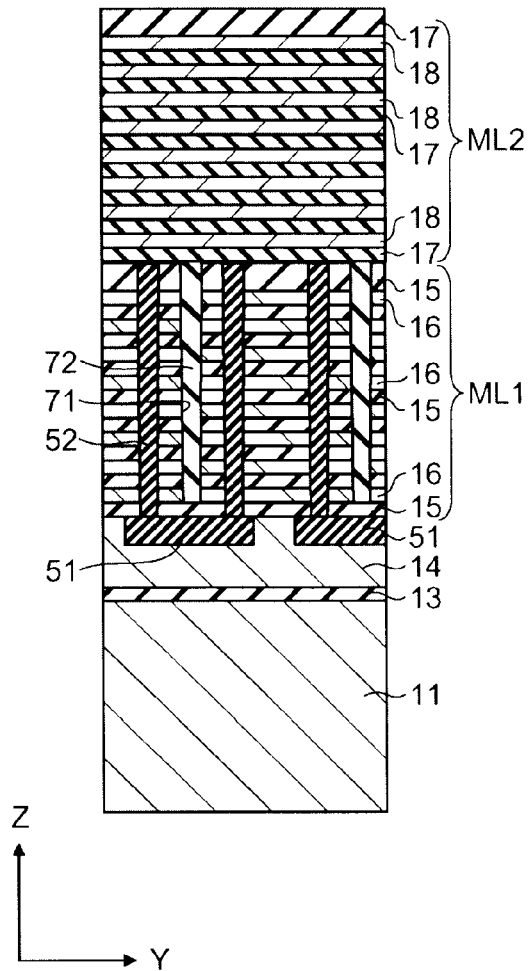

Then, as illustrated in FIGS. 7A and 7B, multiple insulating films 17 and multiple electrode films 18 are alternately stacked on the stacked body ML1 to form the stacked body ML2. Here, each of the lowermost layer and the uppermost layer of the stacked body ML2 is the insulating film 17.

Figure 8A:
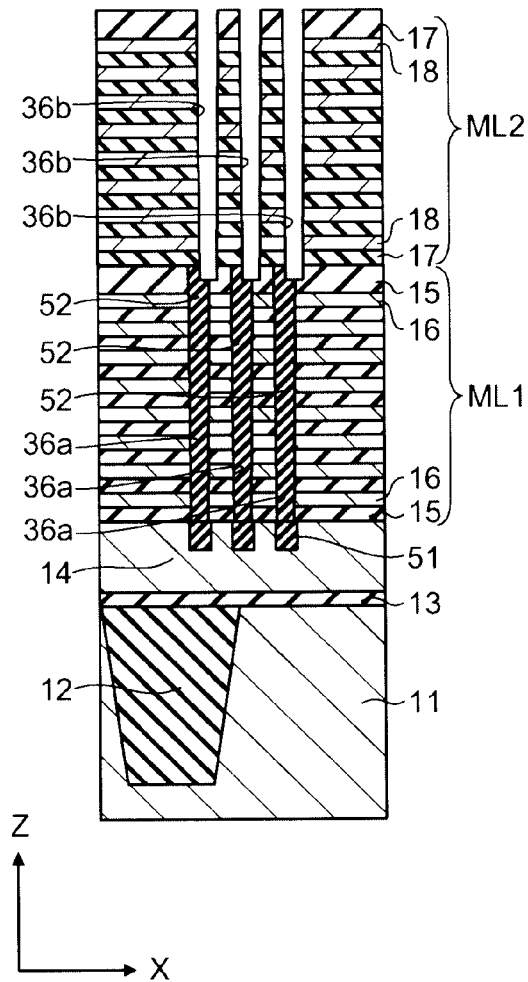
Figure 8B:
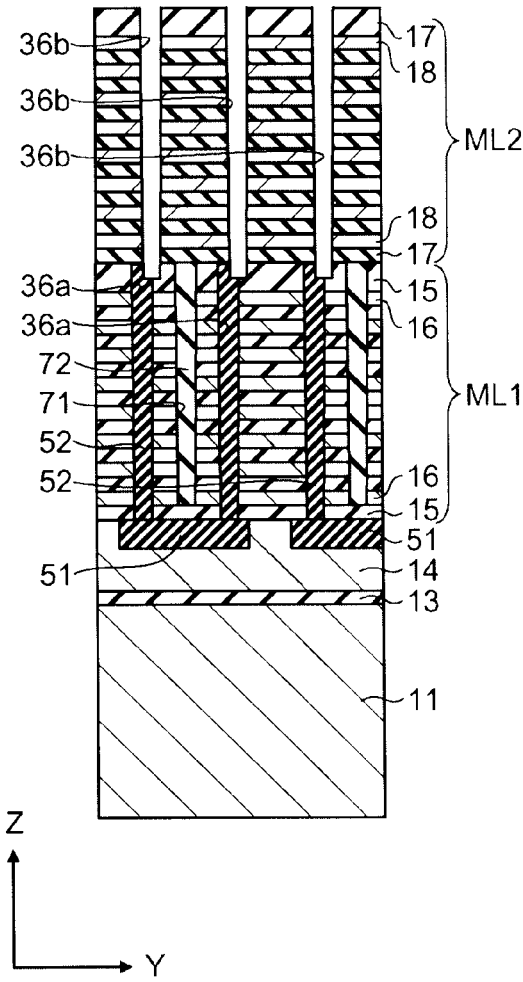

Continuing as illustrated in FIGS. 8A and 8B, RIE and the like are used to make the portions 36b of the through-holes 36 extending in the Z direction as second through-holes of the stacked body ML2. The portions 36b are made in regions directly above the portions 36a. The portions 36b thereby communicate with the portions 36a. At this time, as illustrated in FIG. 2, the position where each portion 36b is to be made is determined with the goal of matching the central axis Cb of the portion 36b and the central axis Ca of the portion 36a. However, actually, the central axis Cb undesirably shifts from the central axis Ca, albeit by different amounts.

Therefore, in this embodiment, the portion 36b is made to pass through the stacked body ML2 to reach partway through the insulating film 15 of the uppermost layer of the stacked body ML1. Thereby, the connecting portion between the portion 36a and the portion 36b has a crank-like configuration, and a portion extending in the horizontal direction is made. The portion 36b is made to a depth to enter into the insulating film 15 of the uppermost layer of the stacked body ML1 such that the minimum width Wab of the connecting portion in a cross section including both the central axes Ca and Cb is larger than the minimum width Wmin of the entire through-hole 36. Although the sacrificial member 52 buried in the portion 36a is exposed at the lower portion of the portion 36b in this process, the sacrificial member 52 may or may not be etched when making the portion 36b.

Figures 9A, 9B:
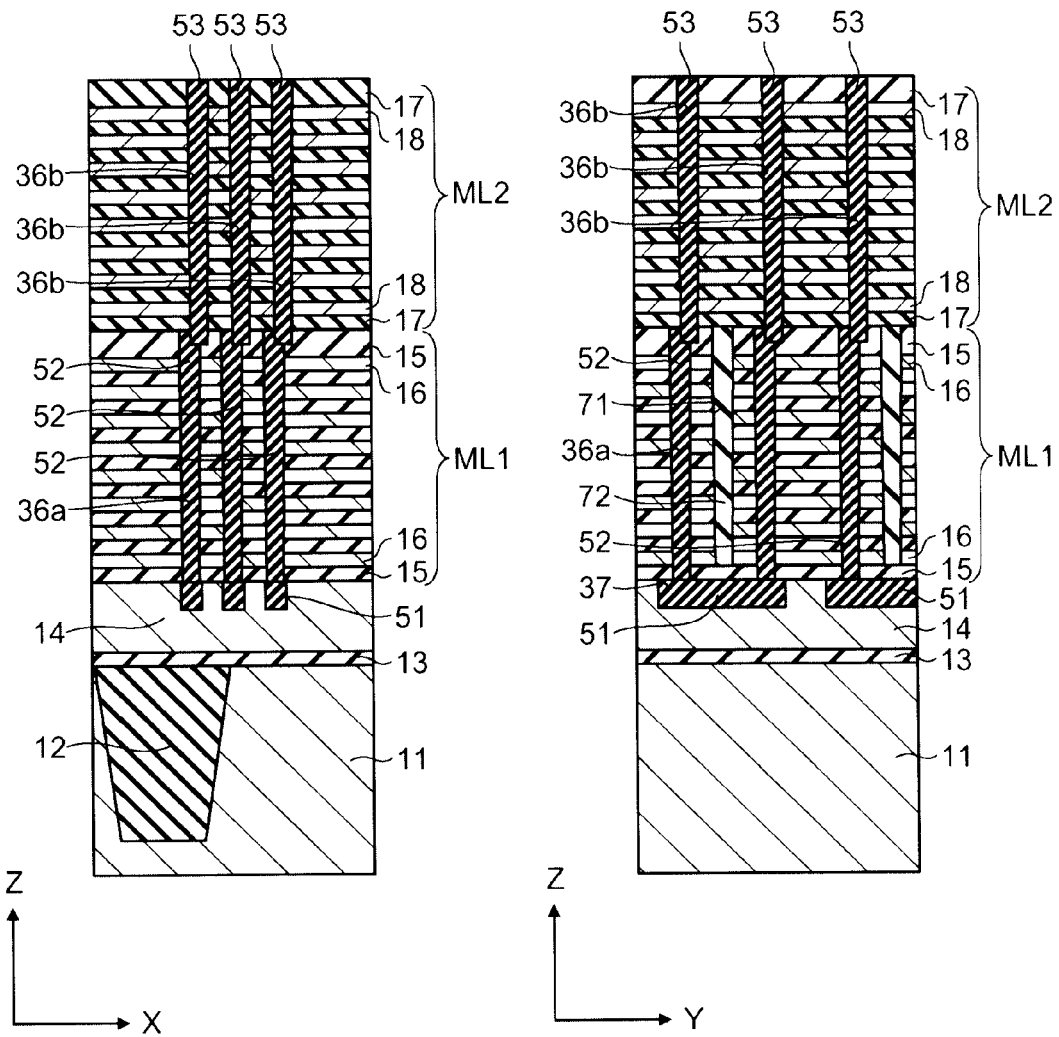

Then, as illustrated in FIGS. 9A and 9B, a sacrificial member 53 is buried in the portion 36b by depositing a sacrificial member on the entire surface of the stacked body ML2 and performing etch-back. Thereby, the sacrificial member 53 contacts the sacrificial member 52 in the portion 36a.

Figure 10A:
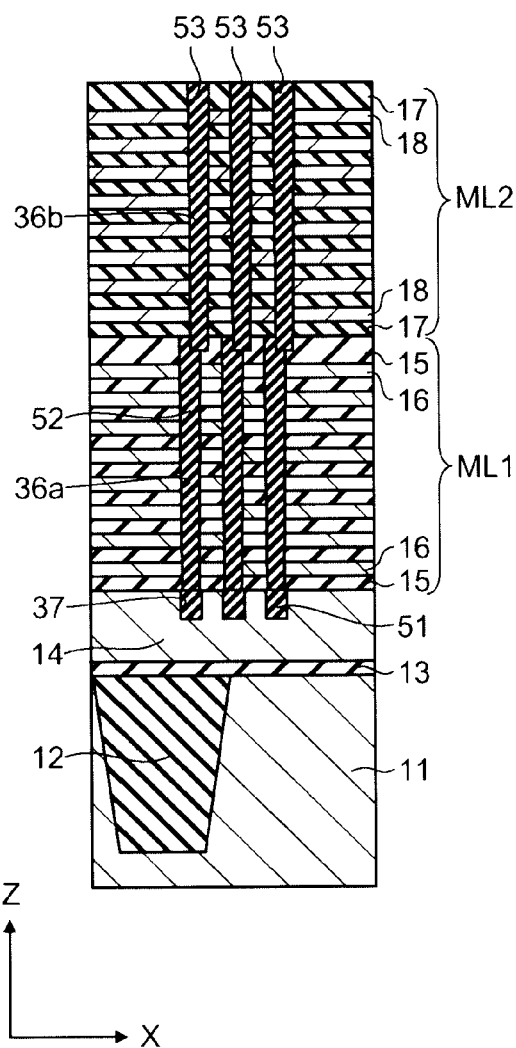
Figure 10B:
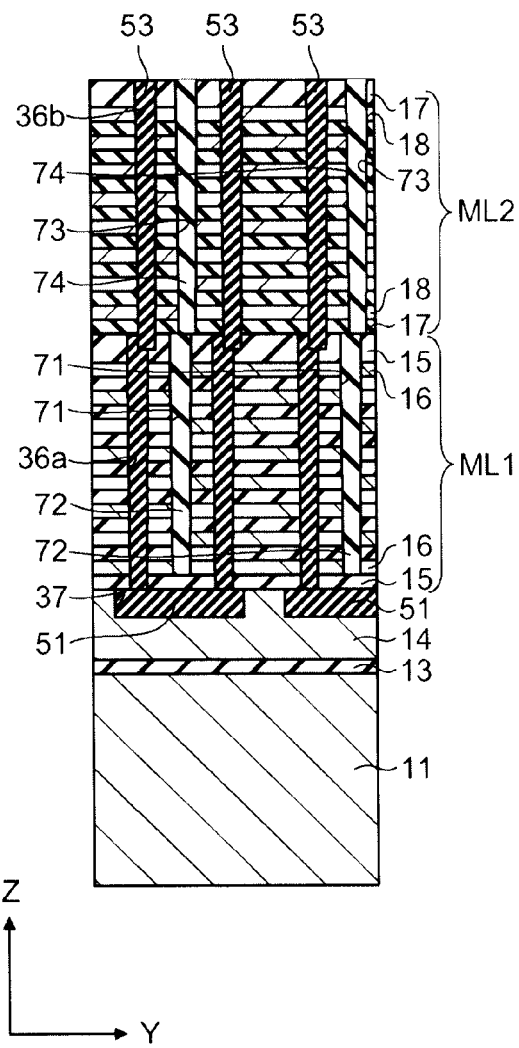

Continuing as illustrated in FIGS. 10A and 10B, a trench 73 extending in the X direction is formed in the stacked body ML2 to connect the regions directly above the recesses 37. Although the trench 73 is formed to a depth to pass completely through the electrode film 18 of the lowermost layer of the stacked body ML2, it is not necessary that the trench 73 reaches the electrode film 16 of the uppermost layer of the stacked body ML1. For example, the trench 73 may reach the upper end portion of the trench 71. Thereby, the electrode films 18 of the stacked body ML2 are patterned into line configurations extending in the X direction and divided between the two portions 36b mutually communicating via the recess 37. An insulating material 74 is then buried in the trench 73, and the upper face is planarized by etch-back and the like. In the case where three or more stacked bodies are formed in the memory unit, the processes illustrated in FIG. 7A to FIG. 10B are repeated to further form stacked bodies above the stacked body ML2.

Then, a resist film (not illustrated) is formed on the stacked body ML2, i.e., the uppermost stacked body. By repeatedly performing etching using the resist film as a mask and slimming of the resist film, a difference in levels is formed for each of the electrode films 16 and 18 at the end portions of the stacked bodies ML1 and ML2 to pattern the stacked bodies ML1 and ML2 into a stairstep configuration.

Figure 11A:
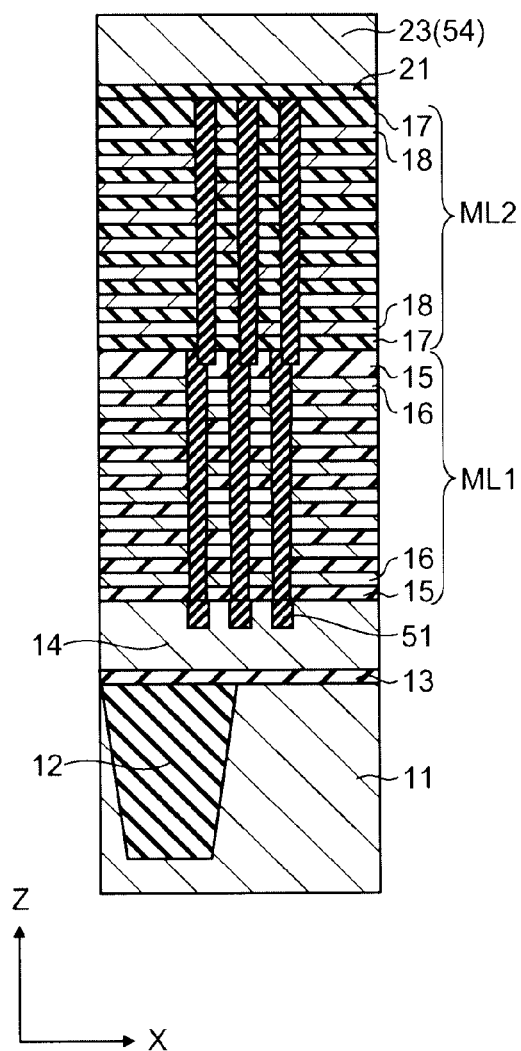
Figure 11B:
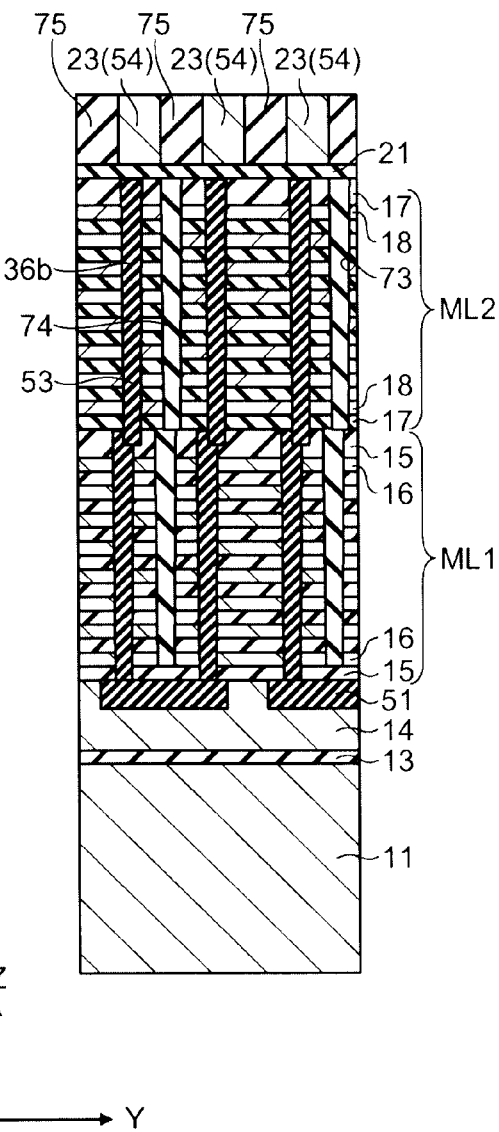

Continuing as illustrated in FIGS. 11A and 11B, an insulating film 21 is formed on the stacked body ML2. An electrode film 54 made of, for example, polysilicon is formed on the insulating film 21. The electrode film 54 is divided along the Y direction and patterned into a striped configuration extending in the X direction. The select gate electrodes 23 extending in the X direction and made of the electrode film 54 are thereby formed. An insulating film 75 is then buried between the select gate electrodes 23, and the upper face is planarized by etch-back and the like.

Figure 12A:
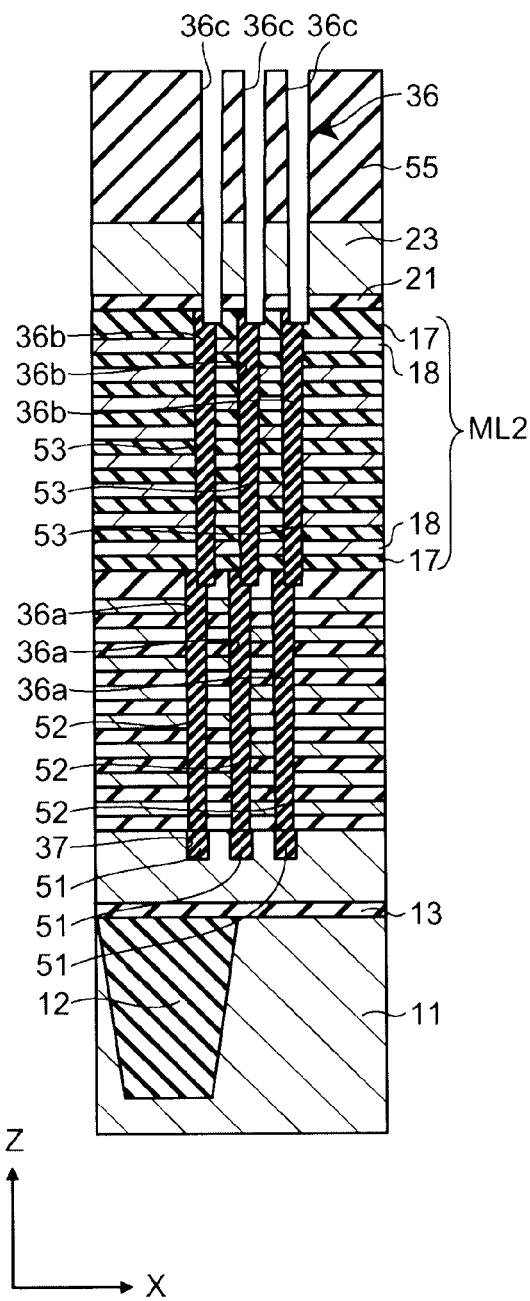
Figure 12B:
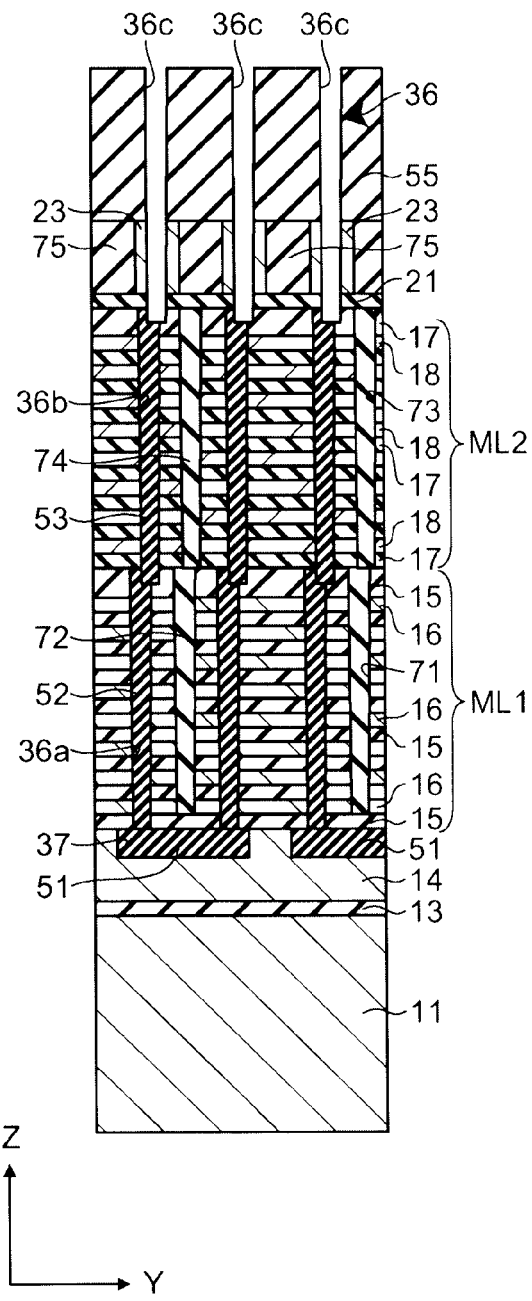

Then, as illustrated in FIGS. 12A and 12B, an insulating film 55 made of, for example, silicon oxide is formed on the select gate electrodes 23 and the insulating film 75. RIE and the like is then used to make the portions 36c of the through-holes 36 extending in the Z direction in the stacked body made of the insulating film 21, the electrode film 54, and the insulating film 55. At this time, the portions 36c are made in regions directly above the portions 36b. The portions 36c thereby communicate with the portions 36b.

The connecting portion between the portion 36b and the portion 36c of the through-hole 36 is formed similarly to the connecting portion between the portion 36a and the portion 36b. In other words, the position where the portion 36c is to be made actually undesirably shifts somewhat despite being determined with the goal of matching the central axis of the portion 36c and the central axis of the portion 36b. Therefore, the portion 36c is made to enter partway through the insulating film 17 of the uppermost layer of the stacked body ML2. Thereby, the connecting portion between the portion 36b and the portion 36c has a crank-like configuration, and a portion extending in a horizontal direction is formed. At this time, the portion 36c is made to a depth to enter into the insulating film 17 of the uppermost layer of the stacked body ML2 such that the minimum width of the connecting portion in a cross section including both the central axis of the portion 36c and the central axis of the portion 36b is larger than the minimum width Wmin (referring to FIG. 2) of the entire through-hole 36.

Figures 13A, 13B:
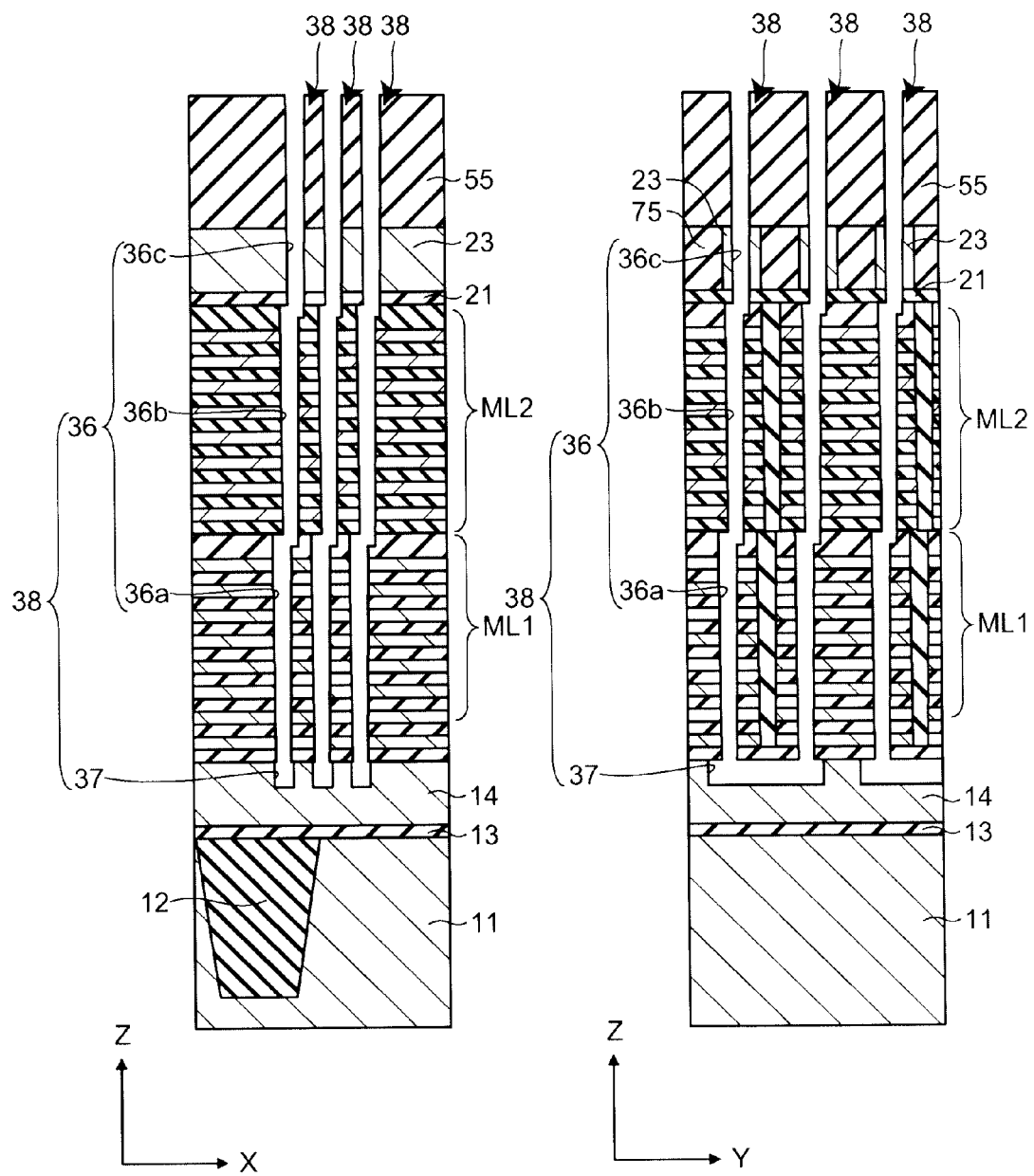

Continuing as illustrated in FIGS. 13A and 13B, wet etching is performed via the portion 36c of the through-hole 36 to remove the sacrificial member 53 (referring to FIGS. 12A and 12B) buried in the portion 36b of the through-hole 36, the sacrificial member 52 (referring to FIGS. 12A and 12B) buried in the portion 36a, and the sacrificial member 51 (referring to FIGS. 12A and 12B) buried in the recess 37. At this time, the sacrificial member 52 can be removed by etching via the portion 36b after removing the sacrificial member 53 from the portion 36b. The sacrificial member 51 can be removed by etching via the portion 36a after removing the sacrificial member 52 from the portion 36a. Thereby, the U-shaped pipe 38 is formed with a hollow interior.

Figure 14A:
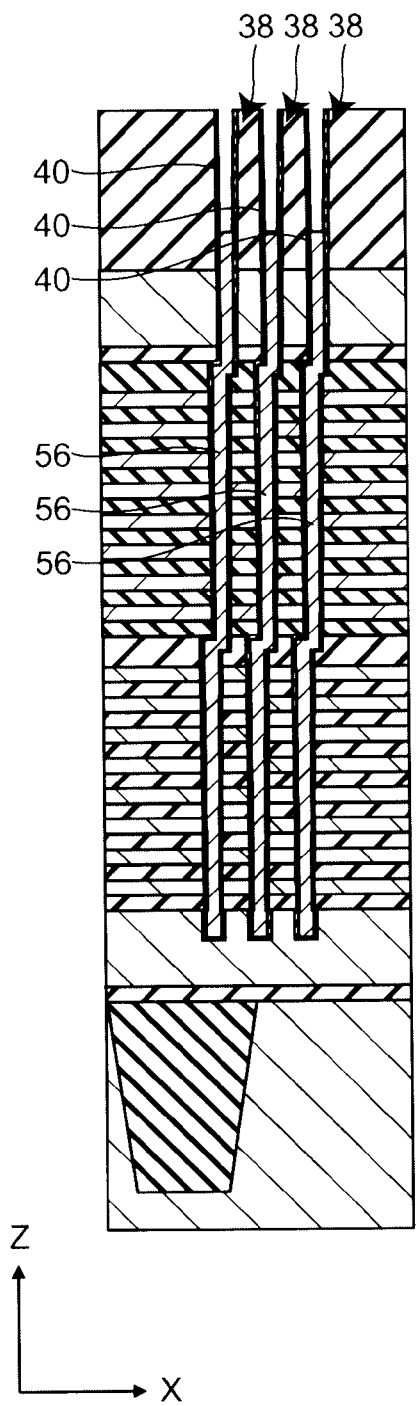
Figure 14B:
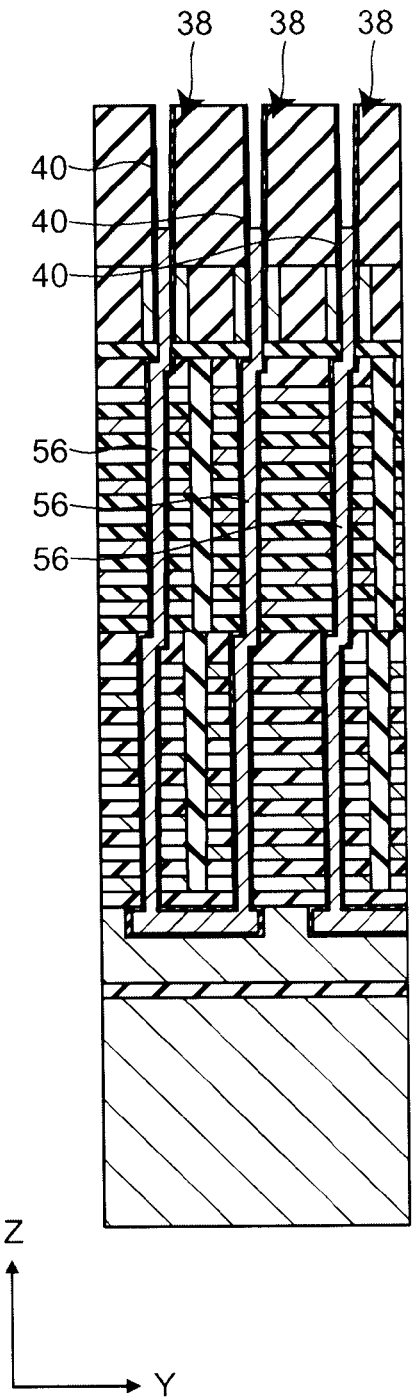

Then, as illustrated in FIGS. 14A and 14B, CVD (Chemical Vapor Deposition), for example, is used to form a blocking film made of silicon oxide, a charge trap film made of silicon nitride, and a tunnel film made of silicon oxide in this order on the inner face of the U-shaped pipe 38 to form the memory film 40 including the stacked blocking film, charge trap film, and tunnel film. Amorphous silicon is then deposited on the entire surface and etch-back is performed to bury amorphous silicon 56 into the recess 37, the portion 36a, the portion 36b, and the lower portion of the portion 36c of the through-hole 36. Subsequently, heat treatment may be performed to crystallize the amorphous silicon 56 to form polysilicon.

Figure 15A:
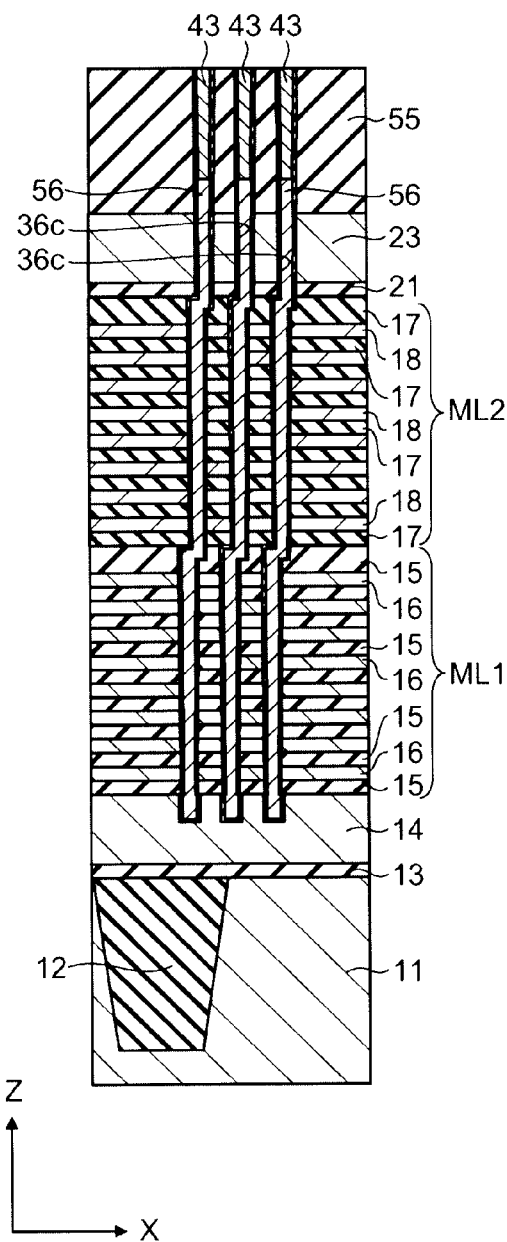
Figure 15B:
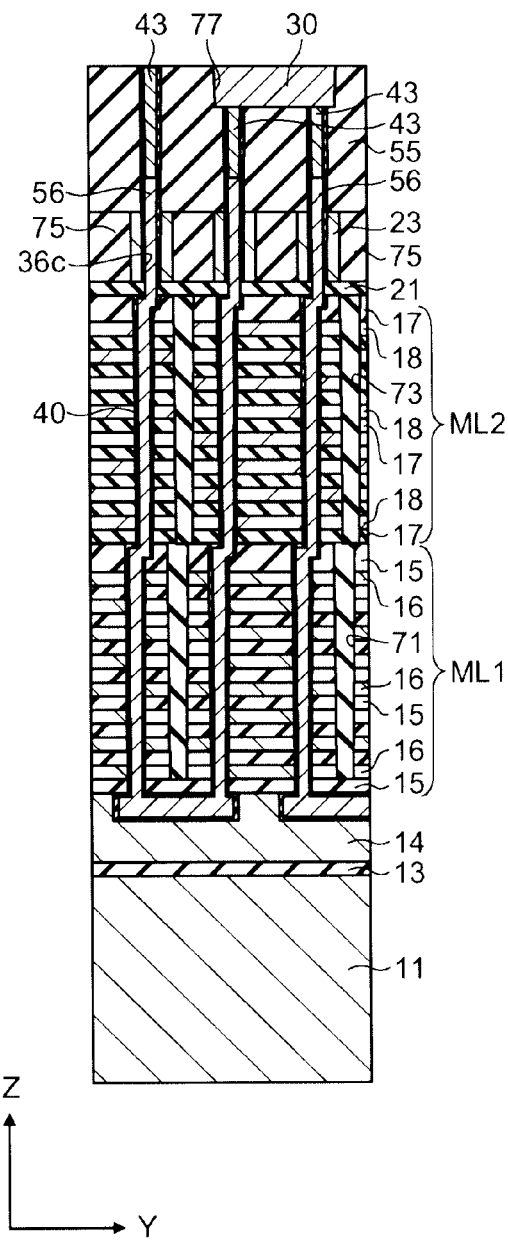

Continuing as illustrated in FIGS. 15A and 15B, contact holes (not illustrated) are formed from above to reach each of the electrode films 16 and 18 and the select gate electrodes 23. Trenches 77 extending in the X direction are formed in the upper layer portion of the insulating film 55. Metal such as, for example, tungsten (W) is deposited on the entire surface of the insulating film 55. At this time, the metal is buried in the trenches 77 and portions where the amorphous silicon 56 of the through-holes 36 is not buried. CMP and the like is used to planarize the upper face of the metal layer, and the metal is thereby removed from the upper face of the insulating film 55 while leaving the metal in the trenches 77 and the through-holes 36. Thereby, the source lines 30 made of metal extending in the X direction are buried in the upper layer portion of the insulating film 55. Vias 43 are made in the upper portion of the portions 36c of the through-holes 36. The insulating films 55 and 75 form the insulating film 22.

Then, as illustrated in FIGS. 1A and 1B, the insulating film 24 made of, for example, silicon oxide is formed on the entire surface, contact holes are made in the insulating film 24, and metal plugs 44 are formed by burying metal in the contact holes and planarizing the upper face. The insulating film 25 made of, for example, silicon nitride is then formed as a stopper film on the insulating film 24. The insulating film 26 made of silicon oxide is formed thereupon as an inter-bit line insulation film. Trenches 79 extending in the Y direction are formed in the insulating film 26, metal such as, for example, copper (Cu) is deposited on the entire surface, and planarization is performed by CMP and the like. Thereby, metal is buried in the trenches 79 to form the bit lines 31 extending in the Y direction. Thereby, the nonvolatile semiconductor memory device 1 is manufactured.

Effects of this embodiment will now be described.

In the nonvolatile semiconductor memory device 1 according to this embodiment, multiple stacked bodies ML1 and ML2 are formed in the memory unit and through-holes are formed in each of the stacked bodies. In other words, the portions 36a of the through-holes 36 are formed after forming the stacked body ML1, and the portions 36b of the through-holes 36 are formed after forming the stacked body ML2. Thereby, the bit density of the memory transistors can be increased by increasing the number of stacks of the electrode films beyond the depth to which a through-hole can be formed by one patterning. However, in the case where shifting occurs between the portion 36a and the portion 36b in such a method, the silicon pillar 42 becomes undesirably fine at the connecting portion between the portion 36a and the portion 36b, unfortunately increasing the resistance of the silicon pillar 42.

Therefore, in the processes illustrated in FIGS. 8A and 8B of this embodiment, the portion 36b of the through-hole 36 is formed to pass through the stacked body ML2 to enter partway into the insulating film 15 of the uppermost layer of the stacked body ML1. Thereby, even in the case where the central axis Cb of the portion 36b is shifted from the central axis Ca of the portion 36a, the connecting portion between the portion 36a and the portion 36b has a crank-like configuration, and the current path in the horizontal direction can be ensured. As a result, the increase of resistance of the silicon pillar 42 at the connecting portion between the portion 36a and the portion 36b can be prevented. The connecting portion between the portion 36b and the portion 36c also is similar.

In particular, in this embodiment as illustrated in FIG. 2, the minimum width Wab of the connecting portion in a cross section including both the central axes Ca and Cb is larger than the minimum width Wmin of the entire through-hole 36. Therefore, the minimum cross-sectional area of the connecting portion can be larger than the minimum cross-sectional area of the entire through-hole 36, reliably preventing the increase of the resistance of the silicon pillar 42 due to shifting between the portion 36a and the portion 36b.

If memory films and silicon pillars are formed for each stacked body when forming multiple stacked bodies in the memory unit, the number of processes undesirably increases and manufacturing costs increase. Therefore, in this embodiment, a sacrificial film is buried in the through-holes made in each stacked body, the sacrificial film is removed after forming all of the stacked bodies, and the memory films and the silicon pillars are formed collectively. Thereby, the number of processes can be prevented from increasing with the number of stacked bodies, and manufacturing costs can be reduced.

However, in such a case where shifting occurs between the portion 36a and the portion 36b and between the portion 36b and the portion 36c of the through-hole 36, the cross-sectional area of the through-hole 36 undesirably decreases at the connecting portion of the U-shaped pipe 38. Thereby, clogging occurs at the connecting portion during formation of the memory film and the silicon pillar by CVD, source-material gas cannot easily reach portions therebelow, and the film formability undesirably declines.

Therefore, in this embodiment as described above, the CVD source-material gas can reach the inner portions of the U-shaped pipe 38 because the connecting portion has a crank-like configuration and the cross-sectional area of the connecting portion is ensured. The memory film and the silicon pillar can thereby be formed suitably along the entire U-shaped pipe 38. In particular, as described above, such effects can be obtained reliably by making the minimum width of the connecting portion larger than the minimum width of the entire through-hole 36.

In this embodiment, the memory film 40 is formed also on the inner face of the portion 36c, that is, the portion of the through-hole 36 surrounded by the select gate electrode 23. Thereby, the memory film 40 can be used as the gate insulation film of the select transistor. As a result, the gate insulation film and the silicon pillar forming the select transistor also can be formed simultaneously with the memory film and the silicon pillar of the memory unit, and the number of processes can be reduced.

Further, the connection member 41 and the silicon pillars 42 in this embodiment are formed integrally without breaks. Therefore, it is not necessary to form contacts between silicon in the lower portion of the through-hole 36. The increase of the resistance of the silicon pillars 42 occurring due to contacts between silicon can thereby be prevented.

Furthermore, one U-shaped pillar 45 is formed in this embodiment by the connection member 41 connecting the lower end portions of the silicon pillars 42 to each other. Therefore, the source lines 30 can be formed as metal wiring disposed above the stacked body ML2 instead of diffusion layers formed in the silicon substrate 11. Thereby, the resistance of the source lines can be reduced, and data can be easily read.

A second embodiment of the invention will now be described.

Figures 16A, 16B:
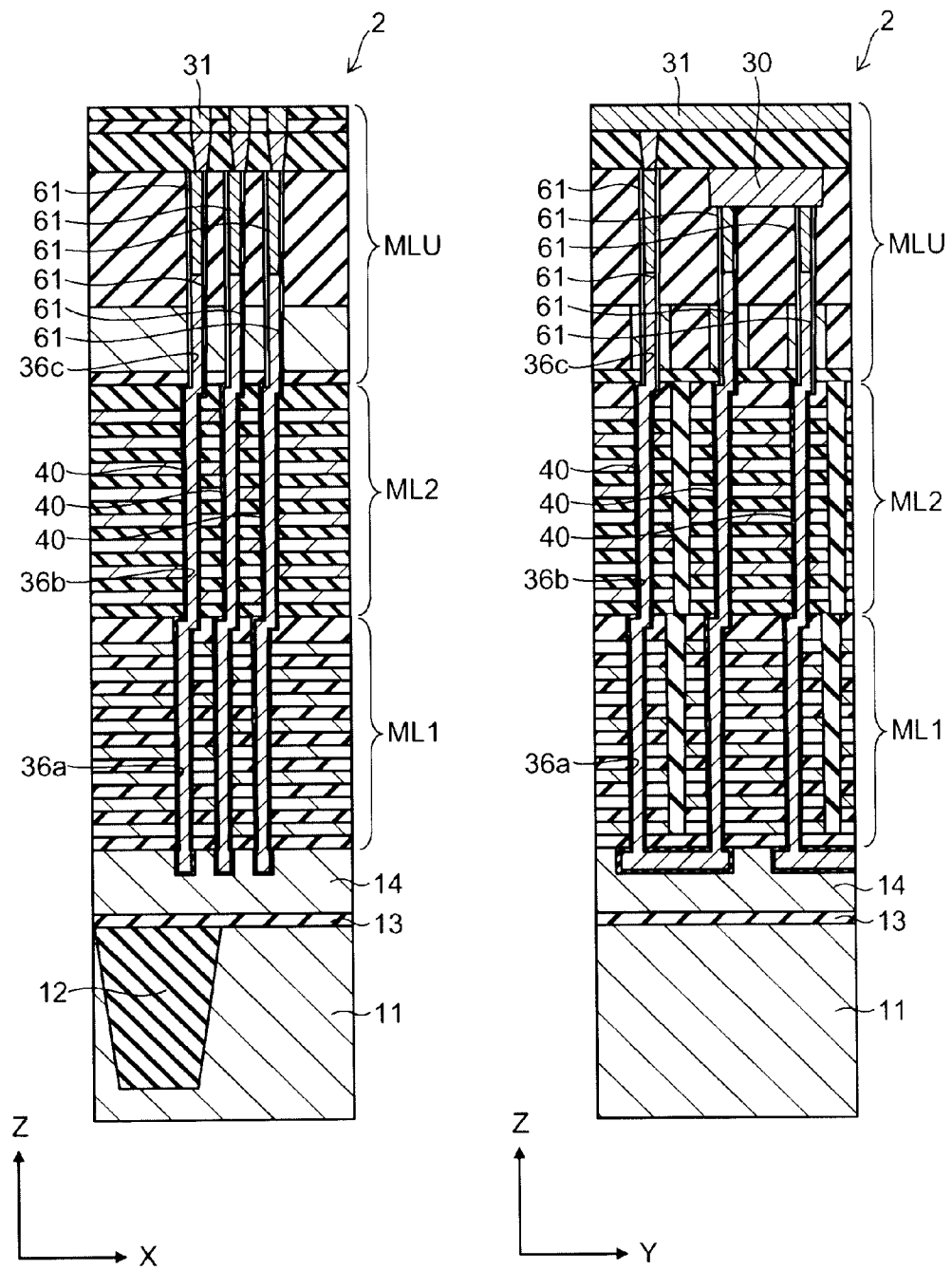
FIGS. 16A and 16B are mutually orthogonal cross-sectional views illustrating a nonvolatile semiconductor memory device according to a second embodiment of the invention.

FIGS. 16A and 16B are mutually orthogonal cross-sectional views illustrating a nonvolatile semiconductor memory device according to this embodiment.

In a nonvolatile semiconductor memory device 2 according to this embodiment illustrated in FIGS. 16A and 16B, an insulating film 61 is formed instead of the memory film 40 on the inner face of the portion 36c of the through-hole 36. Thereby, the gate insulation film of the select transistor is formed of another insulating film 61 rather than the memory film 40. The insulating film 61 is, for example, a single-layer film of a silicon oxide film, silicon nitride film, etc.

Although this embodiment differs from the first embodiment described above in that the insulating film 61 cannot be formed in the same process as the memory film 40, the configuration of the insulating film 61 can be optimal for the gate insulation film of the select transistor. Otherwise, the configuration and effects of this embodiment are similar to those of the first embodiment described above.

A third embodiment of the invention will now be described.

Figure 17A:
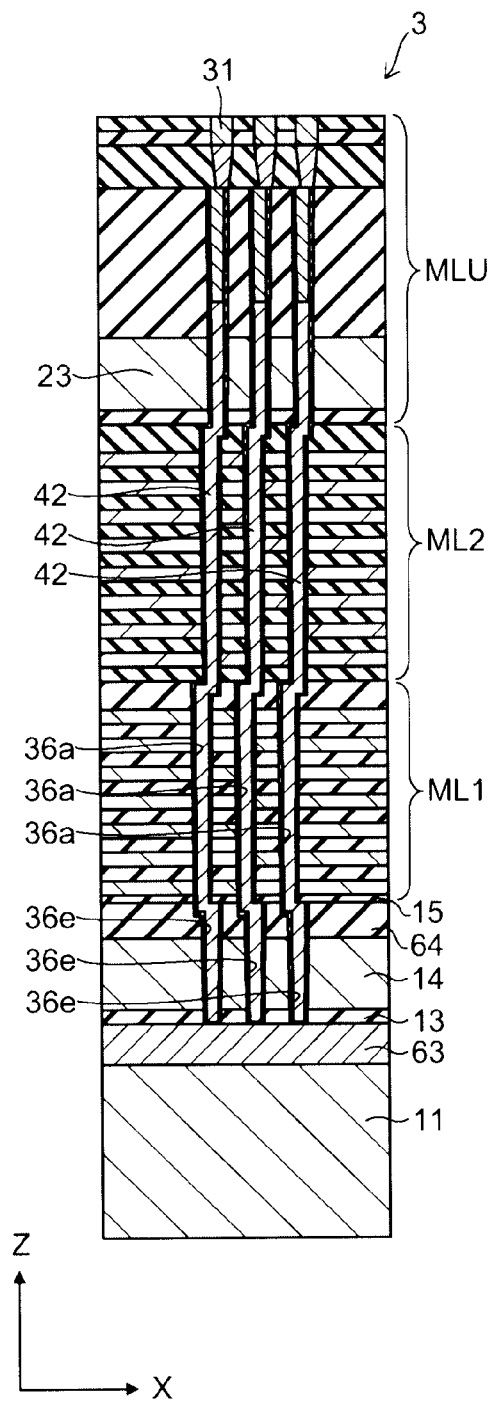
FIGS. 17A and 17B are mutually orthogonal cross-sectional views illustrating a nonvolatile semiconductor memory device according to a third embodiment of the invention.
Figure 17B:
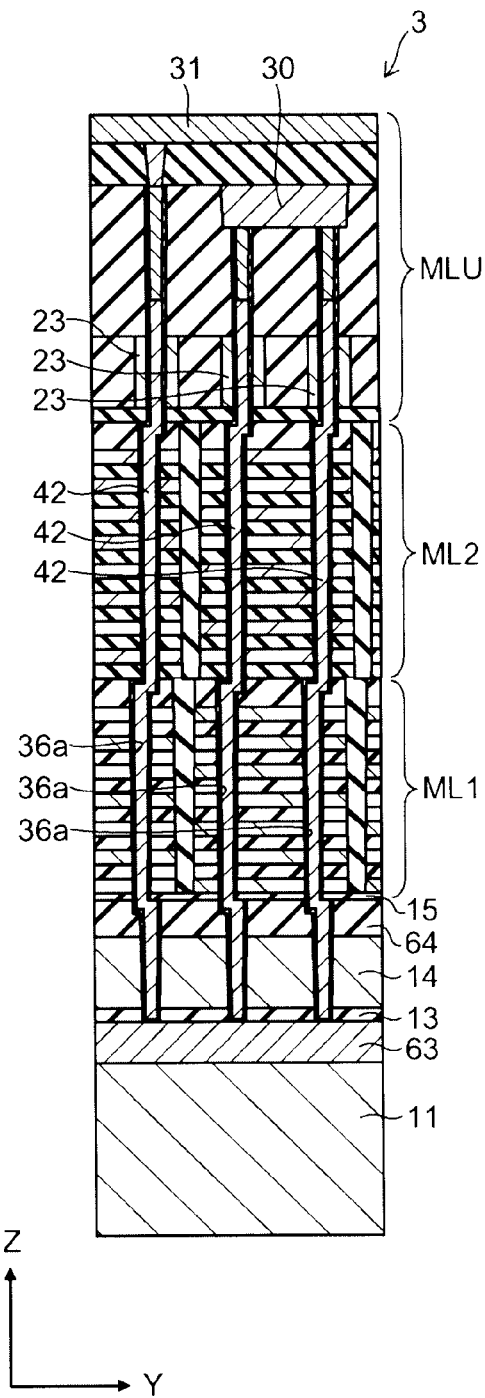

FIGS. 17A and 17B are mutually orthogonal cross-sectional views illustrating a nonvolatile semiconductor memory device according to this embodiment.

In a nonvolatile semiconductor memory device 3 according to this embodiment illustrated in FIGS. 17A and 17B, an impurity diffusion layer is formed to spread along the XY plane in the upper layer portion of the silicon substrate 11 to form a source line 63. On the other hand, source lines are not provided in the upper stacked body MLU. The connection member 41 (referring to FIGS. 1A and 1B) is not provided in the conductive film 14, and the through-holes 36 pass through the conductive film 14 to reach the source line 63.

Thereby, each memory string of the device 3 is an I-shaped memory string including one silicon pillar 42 connected between the bit line 31 and the source line 63. In such a case, the conductive film 14 functions as a lower select gate electrode of each memory string. On the other hand, the select gate electrodes 23 provided in the upper stacked body MLU function as upper select gates.

An insulating film 64 made of, for example, silicon oxide is formed between the conductive film 14 and the stacked body ML1. A portion 36e of the through-hole 36 positioned in the silicon oxide film 13, the conductive film 14, and the insulating film 64 is made in a different process than the portion 36a positioned in the stacked body ML1. Similarly to the other connecting portions, a connecting portion between the portion 36e and the portion 36a has a crank-like configuration.

Similarly to the first embodiment described above, the connecting portion between each of the portions of the through-hole 36 has a crank-like configuration in this embodiment to prevent the increase of the resistance of the silicon pillar at the connecting portion and the decline of the film formability of the memory film and the silicon pillar even in the case where the number of stacks of the electrode films is increased and the through-holes are made in multiple processes. The gate insulation film of the select transistor can be formed in the same process as the charge storage film of the memory unit by forming the memory film on the entire inner face of the through-hole 36 and using the memory film as the gate insulation film of the select transistor. Otherwise, the configuration and effects of this embodiment are similar to those of the first embodiment described above. The configuration of the source line 63 is not limited to a planar configuration and may be, for example, multiple bands extending in the X direction.

A fourth embodiment of the invention will now be described.

Figures 18A, 18B:
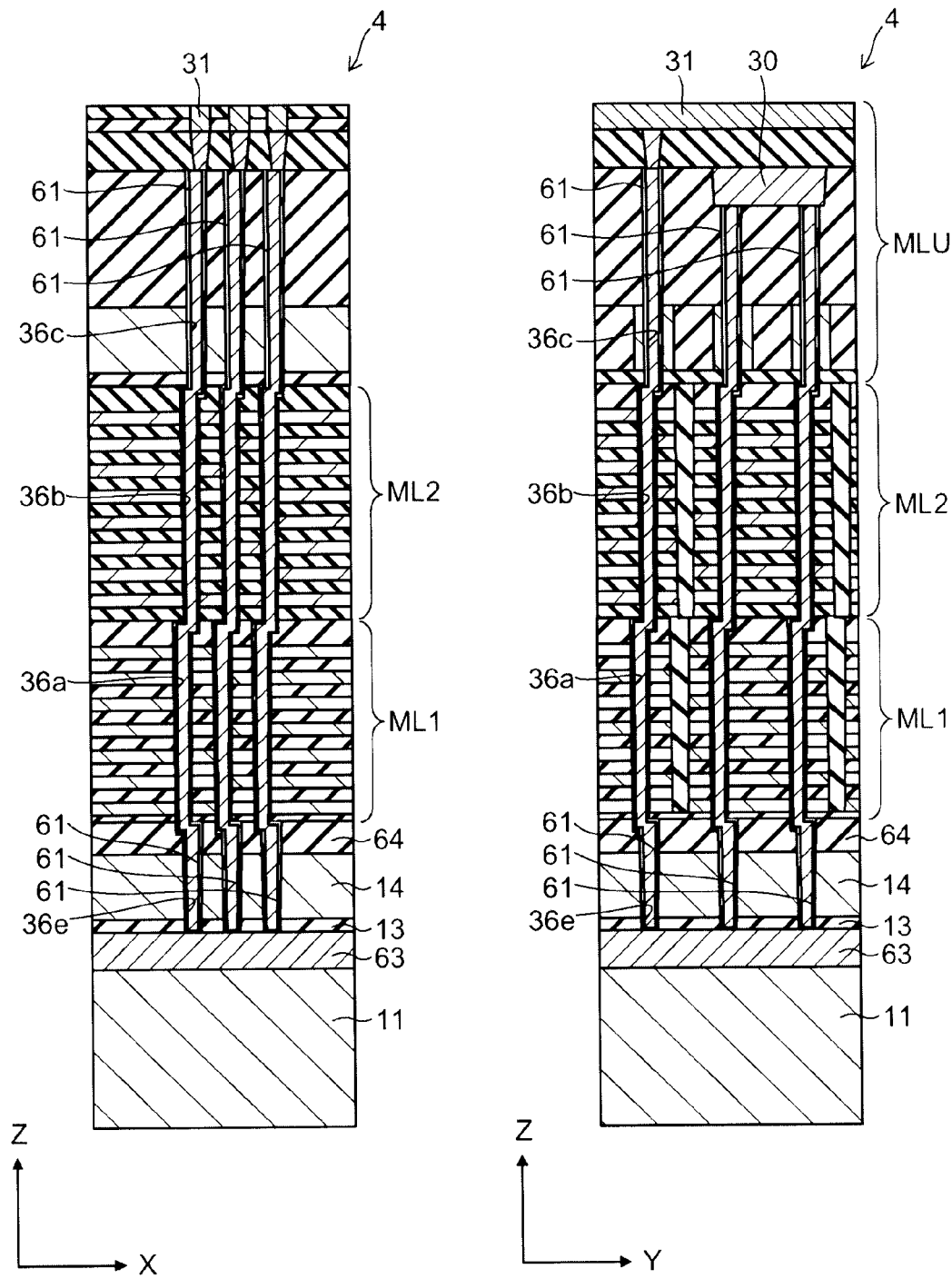
FIGS. 18A and 18B are mutually orthogonal cross-sectional views illustrating a nonvolatile semiconductor memory device according to a fourth embodiment of the invention.

FIGS. 18A and 18B are mutually orthogonal cross-sectional views illustrating a nonvolatile semiconductor memory device according to this embodiment.

As illustrated in FIGS. 18A and 18B, this embodiment is a combination of the second embodiment and the third embodiment described above. In other words, similarly to the third embodiment described above, a nonvolatile semiconductor memory device 4 according to this embodiment includes the source line 63 made of an impurity diffusion layer formed in the silicon substrate 11 and the I-shaped memory string. Similarly to the second embodiment described above, the insulating film 61 is formed instead of the memory film 40 on the inner face of the portion 36e and the portion 36c of the through-hole 36, that is, the portions forming the gate insulation films of the lower and upper select transistors. The insulating film 61 is, for example, a single-layer film of a silicon oxide film, silicon nitride film, etc. Otherwise, the configuration of this embodiment is similar to that of the first embodiment described above; and the effects of this embodiment are similar to those of the second and third embodiments described above.

A fifth embodiment of the invention will now be described.

Figures 19A, 19B:
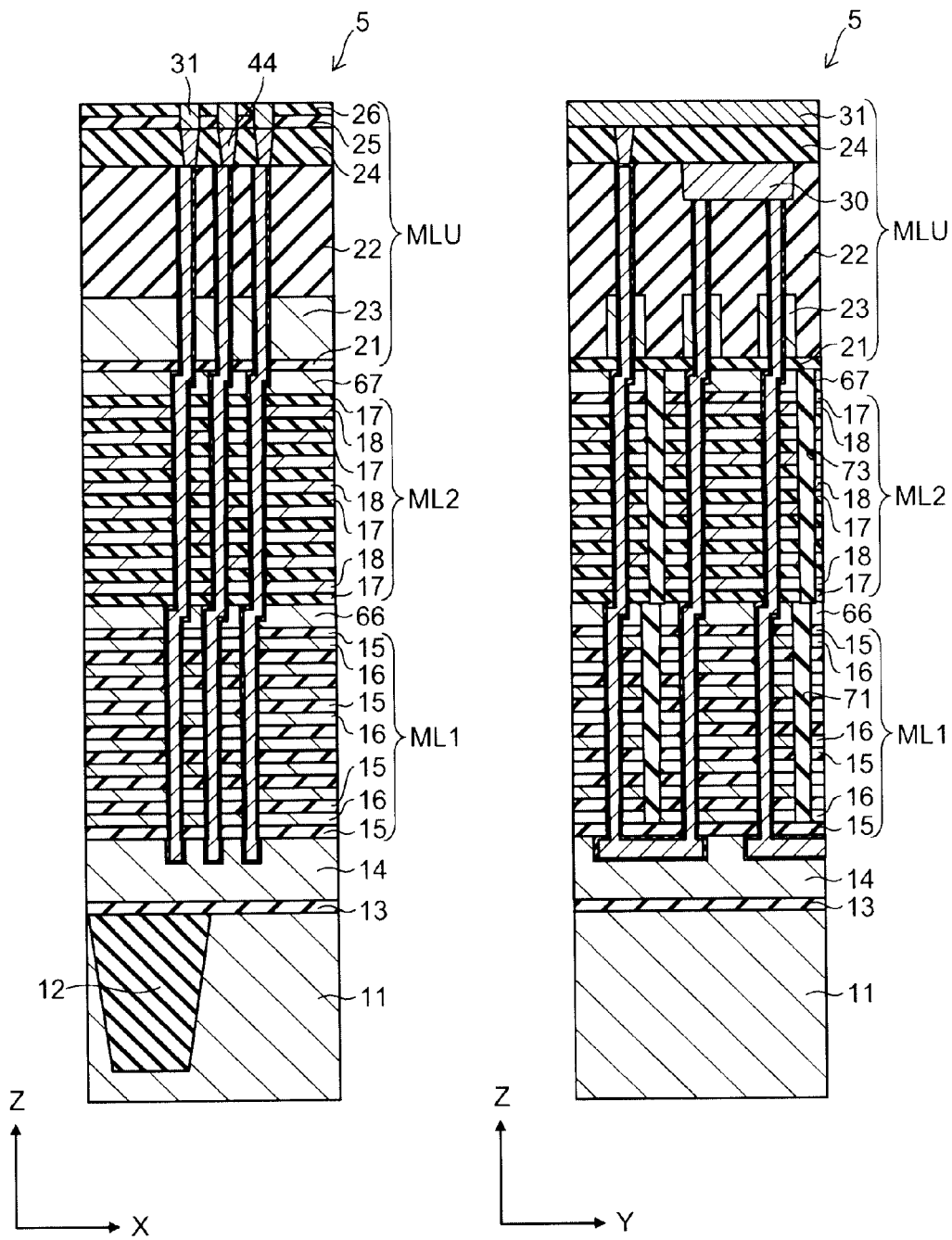
FIGS. 19A and 19B are mutually orthogonal cross-sectional views illustrating a nonvolatile semiconductor memory device according to a fifth embodiment of the invention.

FIGS. 19A and 19B are mutually orthogonal cross-sectional views illustrating a nonvolatile semiconductor memory device according to this embodiment.

Figure 20:
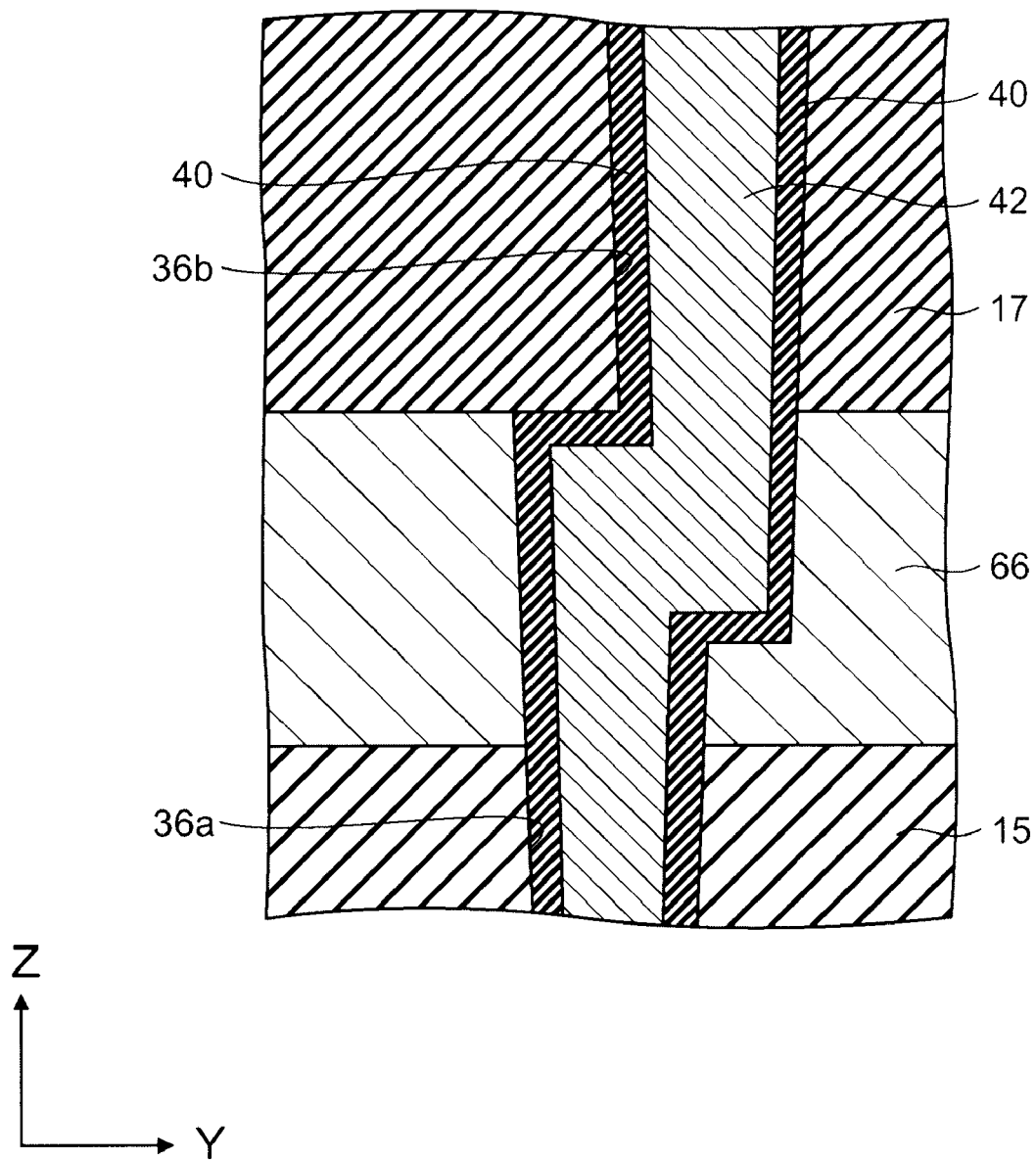
FIG. 20 is a cross-sectional view illustrating a connecting portion of a through-hole of the nonvolatile semiconductor memory device illustrated in FIGS. 19A and 19B.

FIG. 20 is a cross-sectional view illustrating the connecting portion of the through-hole of the nonvolatile semiconductor memory device illustrated in FIGS. 19A and 19B.

A nonvolatile semiconductor memory device 5 according to this embodiment illustrated in FIGS. 19A and 19B and FIG. 20 differs from the nonvolatile semiconductor memory device 1 (referring to FIGS. 1A and 1B) according to the first embodiment described above in that a conductive film 66 is provided between the stacked body ML1 and the stacked body ML2 and a conductive film 67 is provided between the stacked body ML2 and the upper stacked body MLU. The conductive films 66 and 67 are formed of, for example, polysilicon. The connecting portion between the portion 36a and the portion 36b of the through-hole 36 is disposed in the conductive film 66, and the connecting portion between the portion 36b and the portion 36c is disposed in the conductive film 67.

The structure described above can be constructed by, for example, forming the stacked body ML1; subsequently forming a polysilicon film on the stacked body ML1; making the portion 36a of the through-hole 36; burying a sacrificial member; forming the stacked body ML2; and subsequently making the portion 36b. Here, although the portion 36b is made to enter into the polysilicon film formed initially, the portion 36b does not pass completely therethrough.

When using the device 5, potentials are applied to the conductive films 66 and 67 to switch the silicon pillar 42 to a conducting state. For example, in the case where the silicon pillar 42 has an n⁻ conductivity type, a positive potential is applied. Thereby, the resistance value of the silicon pillar 42 at the connecting portions of the through-hole 36 can be reduced even more. Otherwise, the configuration, manufacturing method, operation, and effects of this embodiment are similar to those of the first embodiment described above.

A sixth embodiment of the invention will now be described.

Figures 21A, 21B:
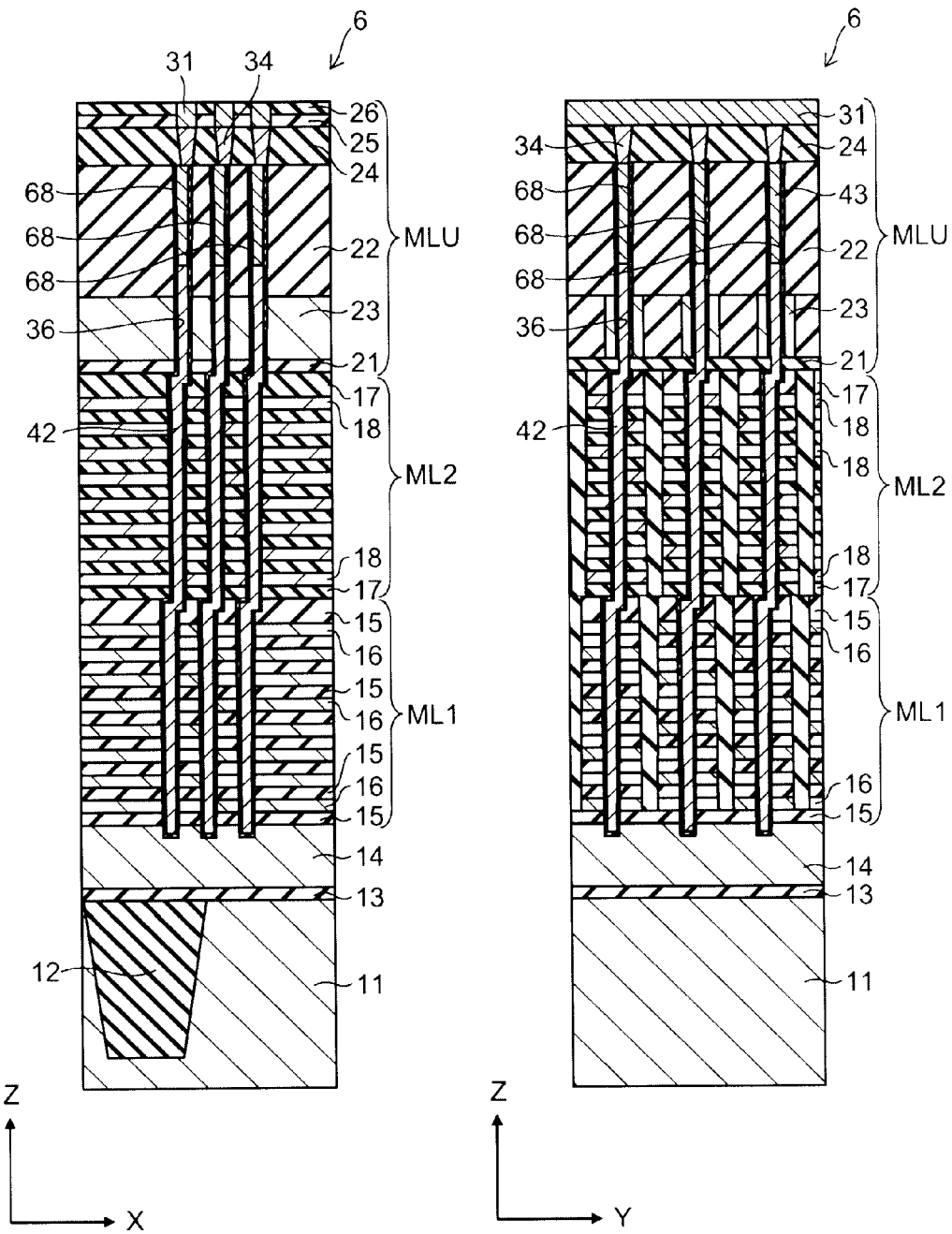
FIGS. 21A and 21B are mutually orthogonal cross-sectional views illustrating a nonvolatile semiconductor memory device according to a sixth embodiment of the invention.

FIGS. 21A and 21B are mutually orthogonal cross-sectional views illustrating a nonvolatile semiconductor memory device according to this embodiment.

A nonvolatile semiconductor memory device 6 according to this embodiment illustrated in FIGS. 21A and 21B differs from the nonvolatile semiconductor memory device 3 (referring to FIGS. 17A and 17B) according to the third embodiment described above in that the through-hole 36 does not pass completely through the conductive film 14, the source line 63 is not provided in the silicon substrate 11, and another insulating film 68 is formed instead of the memory film 40 on the inner face of the through-hole 36. Therefore, although an I-shaped memory string is formed in the nonvolatile semiconductor memory device 6, the lower select transistor is not formed, and only the upper select transistors are provided.

The nonvolatile semiconductor memory device 6 according to this embodiment is an OTP (One Time Programmable)

nonvolatile memory. In one example of an operation method, one silicon pillar 42 is selected by one bit line 31 and one select gate electrode 23 while one word line (the electrode film 16 or 18) is selected and provided with a high potential. Thereby, a high voltage is applied between the selected silicon pillar 42 and the selected word line, and the insulating film 68 disposed therebetween is destructed to form a diode. As a result, data is written to the memory cell formed at the intersection between the selected silicon pillar 42 and the selected word line. Data is read by detecting whether or not the insulating film of the memory cell is destructed, that is, whether or not the rectifying effect of a diode can be confirmed. Because destructive writing is performed to the device 6, data can be written only once.

Otherwise, the configuration and effects of this embodiment are similar to those of the third embodiment described above. In other words, this embodiment also includes connecting portions of through-holes having crank-like configurations and suppresses the increase of the resistance of the silicon pillar. The type and the film thickness of the insulating film 68 may be different among the stacked bodies ML1 and ML2 and the upper stacked body MLU. For example, the insulating film destructed when writing data to the memory cell may be thinner than the gate insulation film of the select transistor.

Hereinabove, the invention is described with reference to exemplary embodiments. However, the invention is not limited to these embodiments. For example, additions, deletions, or design modifications of components or additions, omissions, or condition modifications of processes appropriately made by one skilled in the art in regard to the embodiments described above are within the scope of the invention to the extent that the purport of the invention is included.

The invention claimed is:

1. A nonvolatile semiconductor memory device, comprising:
   a first stacked body including a plurality of insulating films alternately stacked with a plurality of electrode films;
   a second stacked body provided on the first stacked body, the second stacked body including a plurality of insulating films alternately stacked with a plurality of electrode films;
   a through-hole extending in a stacking direction of the first and second stacked bodies to pass through the first and second stacked bodies;
   an insulating layer formed on an inner face of the through-hole; and
   a semiconductor pillar buried in an interior of the through-hole,
   a central axis of a second portion of the through-hole formed in the second stacked body being shifted in a direction intersecting the stacking direction from a central axis of a first portion of the through-hole formed in the first stacked body, a lower end of the second portion being positioned lower than an upper end of the first portion.

2. The device according to claim 1, wherein a minimum width of a connecting portion between the first portion and the second portion in a cross section including both the central axis of the first portion and the central axis of the second portion is larger than a minimum width of the through-hole.

3. The device according to claim 1, further comprising
   an upper stacked body provided on the second stacked body, the upper stacked body having another through-hole formed therein,
   the upper stacked body including:
   a first insulating film;
   a select gate electrode provided on the first insulating film;
   a second insulating film provided on the select gate electrode; and
   another semiconductor pillar buried in an interior of the other through-hole,
   the other through-hole passing through the select gate electrode to communicate with the through-hole,
   a central axis of the other through-hole being shifted in a direction intersecting the stacking direction from the central axis of the second portion of the through-hole, a lower end of the other through-hole being positioned lower than an upper end of the second portion.

4. The device according to claim 3, wherein a minimum width of a connecting portion between the second portion and the other through-hole in a cross section including both the central axis of the second portion and the central axis of the other through-hole is larger than a minimum width of an entirety of the second portion and the other through-hole.

5. The device according to claim 1, wherein the first portion and the second portion have tapered configurations becoming finer downward.

6. The device according to claim 1, wherein the insulating films stacked in the first and second stacked bodies are formed of silicon oxide and the electrode films are formed of silicon.

7. The device according to claim 1, wherein the insulating layer includes:
   a blocking film made of silicon oxide;
   a charge trap film made of silicon nitride; and
   a tunnel film made of silicon oxide.

8. The device according to claim 1, further comprising a conductive film provided between the first stacked body and the second stacked body.

9. The device according to claim 1, further comprising:
   a plurality of source lines provided on the second stacked body, extending in a first direction intersecting the stacking direction, and connected to an upper end portion of a portion of the semiconductor pillars;
   a plurality of bit lines provided on the second stacked body, extending in a second direction intersecting both the stacking direction and the first direction, and connected to an upper end portion of the remainder of the semiconductor pillars; and
   a connection member mutually connecting a lower end portion of one of the semiconductor pillars having an upper end portion connected to the source line with a lower end portion of another one of the semiconductor pillars having an upper end portion connected to the bit line.

10. A nonvolatile semiconductor memory device, comprising:
    a first stacked body including a plurality of insulating films alternately stacked with a plurality of electrode films;
    a second stacked body provided on the first stacked body, the second stacked body including a plurality of insulating films alternately stacked with a plurality of electrode films;
    a through-hole extending in a stacking direction of the first and second stacked bodies to pass through the first and second stacked bodies;
    an insulating layer formed on an inner face of the through-hole; and
    a semiconductor pillar buried in an interior of the through-hole,
    the through-hole including a plurality of portions having mutually shifted central axes, a connecting portion between the portions having a crank-like configuration.

11. The device according to claim 10, wherein a minimum width of the connecting portion in a cross section including both central axes of two of the portions communicating via the connecting portion is larger than a minimum width of the through-hole.

12. The device according to claim 10, further comprising
an upper stacked body provided on the second stacked body, the upper stacked body having another through-hole formed therein,
the upper stacked body including:
a first insulating film;
a select gate electrode provided on the first insulating film;
a second insulating film provided on the select gate electrode; and
another semiconductor pillar buried in an interior of the other through-hole,
the other through-hole passing through the select gate electrode to communicate with the through-hole,
a connecting portion between the through-hole and the other through-hole having a crank-like configuration.

13. The device according to claim 12, wherein a minimum width of a connecting portion between the through-hole and the other through-hole in a cross section including both a central axis of the portion forming an uppermost portion of the through-hole and a central axis of the other through-hole is larger than a minimum width of an entirety of a portion forming the uppermost portion and the other through-hole.

14. The device according to claim 10, wherein each of the portions has a tapered configuration becoming finer downward.

15. The device according to claim 10, wherein the insulating films stacked in the first and second stacked bodies are formed of silicon oxide and the electrode films are formed of silicon.

16. The device according to claim 10, wherein the insulating layer includes:
a blocking film made of silicon oxide;
a charge trap film made of silicon nitride; and
a tunnel film made of silicon oxide.

17. The device according to claim 10, further comprising a conducting film provided between the first stacked body and the second stacked body.

18. The device according to claim 10, further comprising:
a plurality of source lines provided on the second stacked body, extending in a first direction intersecting the stacking direction, and connected to an upper end portion of a portion of the semiconductor pillars;
a plurality of bit lines provided on the second stacked body, extending in a second direction intersecting both the stacking direction and the first direction, and connected to an upper end portion of the remainder of the semiconductor pillars; and
a connection member mutually connecting a lower end portion of one of the semiconductor pillars having an upper end portion connected to the source line with a lower end portion of another one of the semiconductor pillars having an upper end portion connected to the bit line.

19. A method for manufacturing a nonvolatile semiconductor memory device, comprising:
alternately stacking a plurality of insulating films and a plurality of electrode films on a substrate to form a first stacked body;
forming a first through-hole in the first stacked body to extend in a stacking direction of the first stacked body;
burying a sacrificial member in the first through-hole;
alternately stacking a plurality of insulating films and a plurality of electrode films on the first stacked body to form a second stacked body;
forming a second through-hole in the second stacked body to extend in the stacking direction and communicate with the first through-hole;
performing etching via the second through-hole to remove the sacrificial member;
forming an insulating layer on an inner face of the first and second through-holes; and
burying a semiconductor material in an interior of the first and second through-holes to form a semiconductor pillar,
the second through-hole being formed to enter into an interior of the first stacked body.

20. The method according to claim 19, wherein the second through-hole is formed to a depth to enter into an interior of the first stacked body such that a minimum width of a connecting portion between the first through-hole and the second through-hole in a cross section including both a central axis of the first through-hole and a central axis of the second through-hole is larger than a minimum width of an entirety of the first and second through-holes.

* * * * *